United States Patent [19]
Watanabe et al.

[11] Patent Number: 5,546,349
[45] Date of Patent: Aug. 13, 1996

[54] EXCHANGEABLE HIERARCHICAL DATA LINE STRUCTURE

[75] Inventors: Yohji Watanabe, Fishkill, N.Y.; John K. DeBrosse, Burlington, Vt.

[73] Assignees: Kabushiki Kaisha Toshiba, Japan; International Business Machines, Armonk, N.Y.

[21] Appl. No.: 403,265

[22] Filed: Mar. 13, 1995

[51] Int. Cl.⁶ .................................................. G11C 8/00
[52] U.S. Cl. ........................................ 365/230.04; 365/63
[58] Field of Search ...................... 365/230.04, 230.03, 365/51, 63, 200, 190, 189.01

[56] References Cited

U.S. PATENT DOCUMENTS

| | | | |
|---|---|---|---|
| 3,297,085 | 3/1994 | Choi et al. | 365/200 |
| 4,586,171 | 4/1986 | Fujishima | 365/205 |
| 4,694,428 | 9/1987 | Matsumura et al. | 365/51 |
| 4,700,328 | 10/1987 | Burghard | 365/51 |
| 4,800,525 | 1/1989 | Shah et al. | 365/72 |
| 4,807,191 | 2/1989 | Flannagan | 365/200 |
| 4,866,676 | 9/1989 | Crisp et al. | 365/200 |
| 4,903,344 | 2/1990 | Inoue | 365/51 |
| 5,058,058 | 10/1991 | Yasuda et al. | 365/51 |
| 5,134,588 | 7/1992 | Kubota et al. | 365/207 |
| 5,214,600 | 5/1993 | Cho et al. | 365/51 |
| 5,227,999 | 7/1993 | Ihara et al. | 365/200 |
| 5,243,558 | 9/1993 | Saeki | 365/63 |
| 5,321,646 | 6/1994 | Tomishima | 365/51 |
| 5,355,339 | 10/1994 | Oh et al. | 365/200 |
| 5,377,146 | 12/1994 | Reddy et al. | 365/200 |
| 5,386,387 | 1/1995 | Tanizaki | 365/200 |
| 5,396,451 | 3/1995 | Ema | 365/51 |

OTHER PUBLICATIONS

Masao Taguchi et al., "A 40–ns 64–MB DRAM with 64–b Parallel Data Bus Architecture", *IEEE Journal of Solid-State Circuits*, vol. 26, No. 11, Nov. 1991, pp. 1493–1497.

*Primary Examiner*—A. Zarabian
*Attorney, Agent, or Firm*—Banner & Allegretti, Ltd.

[57] ABSTRACT

An exchangeable hierarchical data line structure includes a first half of a unit circuit, a second half of a unit circuit and a common sense amplifier row disposed therebetween. The common sense amplifier row includes a common plurality of sense amplifiers and a common local data line. The structure includes a first set of master data lines with a first master data line and a third master data line, and a second set of master data lines with a second master data line and a fourth master data line. The master data lines form a master bus transversing the direction of the common local data line. The structure includes first switch circuitry to selectively couple signals between the common local data line and the first master data line. The structure includes second switch circuitry to selectively couple signals between the common local data line and the second master data line. A signal on the common local data line is couplable to the first master data line when the signal on the common local data line is not coupled to the second master data line, and the signal on the common data line is couplable to the second master data line when the signal on the common local data line is not coupled to first master data line.

7 Claims, 16 Drawing Sheets

EXCHANGEABLE HIERARCHICAL DATA LINE STRUCTURE

BACKGROUND OF THE INVENTION

1. Field of the Invention

The present invention relates to large capacity dynamic random access memory integrated circuits. In particular, the invention relates to an exchangeable hierarchical data line structure for accessing memory cell arrays within the memory circuit which permits elimination of some circuits with the result of a corresponding reduction in the integrated circuit size.

2. Description Of Related Art

Large capacity dynamic random access memories are organized in a hierarchical structures. For example, as described with respect to the present invention the dynamic random access memory includes of sixteen unit circuits, each unit circuit includes sixteen block circuits, each block circuit includes sixteen segments, and each segment include 32 (plus a spare) segment cell array circuits. The segments and block circuits are arranged in a checker board of 256 squares. This form of architecture is referred as a hierarchical architecture. The present invention will be described within the context of a single unit circuit comprised of a plurality of block circuits each having a plurality of segments. Taguchi, et at., in a paper titled "A 40-ns 64-Mb DRAM with 64-b Parallel Data Bus Architecture" (published in the November 1991 IEEE Journal of Solid-State Circuits, Vol. 26, No. 11) is incorporated herein by reference and describes a hierarchical architecture memory circuit with a single-sided shared sense amplifier. The Taguchi, et at. circuit includes a segment slice comprising a cell array from each of the block circuits. Between every two cell arrays is a row of sense amplifiers shared between the two adjacent cell arrays (e.g., see FIG. 10). The sense amplifier are single sided sense amplifiers shared between adjacent cell arrays (e.g. see description with respect to FIG. 5). Two local data lines run within the row of sense amplifiers. Signals on bit lines within a sense amplifier are transferable between the local data lines and bit lines. The local data lines are couplable to predetermined master data lines. Master data lines are organized into two sets of data lines: an upper set and a lower set. Half of the local data lines are couplable to the upper set of data lines and the other half of the local data lines are couplable to the lower set of data lines. In this way the upper set of data lines are shared by half of the sense amplifiers and the lower set of data lines are shared by the other half of the sense amplifiers. By using the master data lines separated into an upper set of data lines and a lower set of data lines, two cell arrays may be operated simultaneously to provide efficient refresh mode operations or data testing and reduce the active power required compared to a one block per unit activation architecture since twice as many memory cells can be refreshed at a time.

However, in order to achieve higher capacity in the same area (i.e., more integration density) it is desirable to employ a double sided sense amplifier layout shared between adjacent cell arrays as described herein with respect to FIG. 7, and it is desirable to provide a separate row redundancy block to increase the yield in manufacturing circuits. Co-pending U.S. patent application (Ser. No. 08/346,965, filed Nov. 30, 1994 by Kirihata et at.), incorporated herein by reference and entitled "A Random Access Memory Having A Flexible Array Redundancy Scheme", describes advanced redundancy concepts. Co-pending U.S. patent application (Ser. No. 08/346,966, filed Nov. 30, 1994 by Kirihata et at.), incorporated herein by reference and entitled "A Random Access Memory With A Simple Test Arrangement", describes testing of such advanced memory arrays.

Direct replacement of the single ended sense amplifiers with double ended sense amplifiers would result in two problems. First, two separate redundancy blocks would be needed to replace respective defective word line circuits associated with the upper and lower halves. This would tend to reduce replacement efficiency and increase the number of sense amplifiers required resulting a lower yield and a larger integrated circuit area. Secondly, the sense amplifiers placed on the upper and lower boundaries of the cell array areas cannot be shared. Use of double sided sense amplifiers would result in an extra boundary row of sense amplifiers. When the chip architecture is organized into upper and lower halves, this would result in two extra sense amplifier boundaries (i.e., requiring a bigger chip).

SUMMARY OF THE INVENTION

It is an object to the present invention to achieve a hierarchical data line structure where sense amplifiers can be disposed between adjacent cell arrays and can be shared between the adjacent cell arrays for all cell arrays. It is a further object of the present invention to provide a redundancy block architecture where a single redundancy block provides spare replacement circuits for either upper half or lower half circuits of a segment slice.

These and other objects are achieved in an exchangeable hierarchical data line structure which includes a first half of a unit circuit, a second half of a unit circuit and a common sense amplifier row disposed therebetween. The common sense amplifier row includes a common plurality of sense amplifiers and a common local data line. The structure includes a first set of master data lines with a first master data line and a third master data line, and a second set of master data lines with a second master data line and a fourth master data line. The master data lines form a master bus transversing the direction of the common local data line. The structure includes first switch circuitry to selectively couple signals between the common local data line and the first master data line. The structure includes second switch circuitry to selectively couple signals between the common local data line and the second master data line. A signal on the common local data line is couplable to the first master data line when the signal on the common local data line is not coupled to the second master data line, and the signal on the common data line is couplable to the second master data line when the signal on the common local data line is not coupled to first master data line.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

A hierarchical data line structure is used in dynamic random access memories (hereinafter DRAMs) to realize a wide I/O organization (i.e., a large number of I/O data bits) or an efficient data compression test mode. Such hierarchical data line structures maybe employed in advanced DRAMs having large bit storage capacity, for example 256 megabits. It is convenient to divide the bit storage requirement into a plurality of units. Each unit might store, for example 16 megabits each, and sixteen such units would be used to make up a 256 megabit DRAM.

Figure 1:
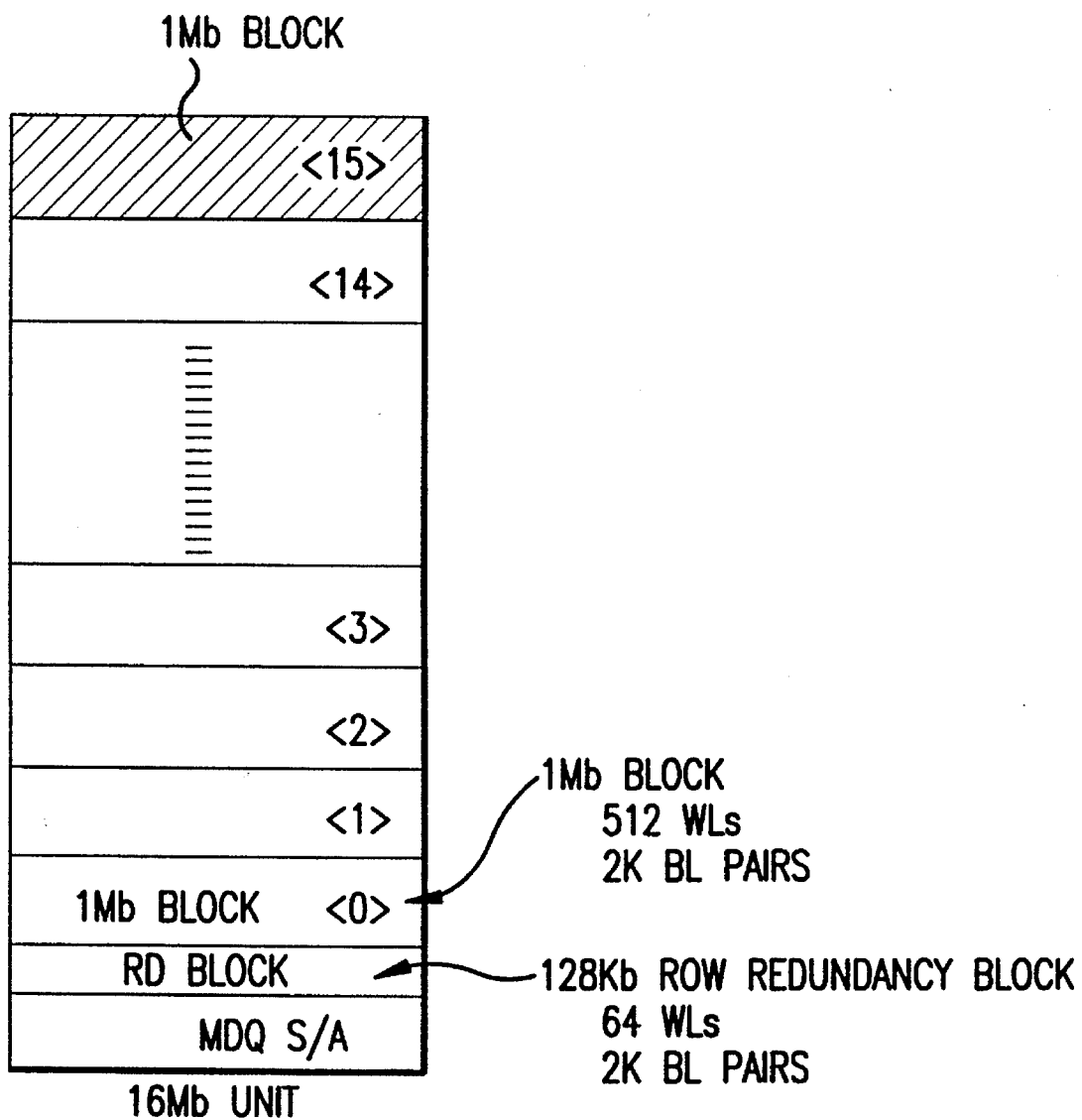
FIG. 1 is a block diagram of unit circuitry.

FIG. 1 is a blocked diagram of such unit circuitry. The unit circuitry is comprised of sixteen 1 megabit blocks, a redundancy block (e.g., 128 kilobits) and master data bus sense amplifier row MDQSA.

Figure 2:
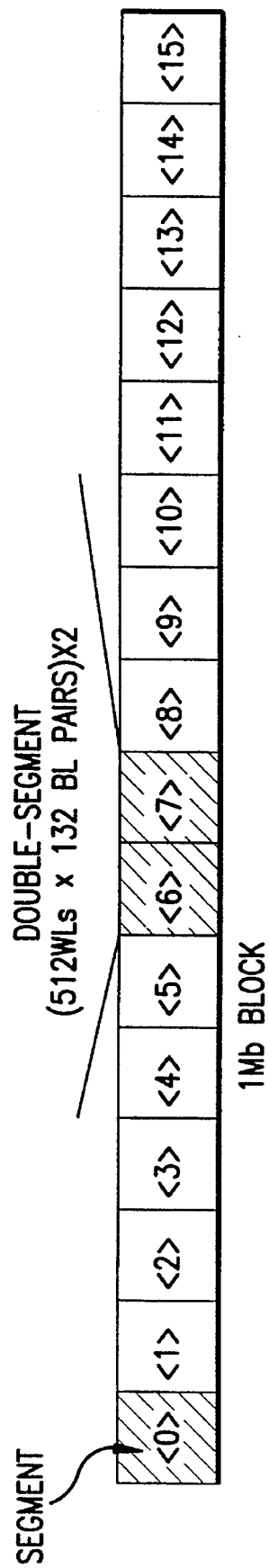
FIG. 2 is a block diagram of block circuitry having a plurality of segments.

In FIG. 2, each 1 megabit block includes 16 segments, denoted 0–15. Each segment includes memory cell arrays, preferably organized as 512 word lines by 132 bit line pairs which number includes four bit line pairs as spare bit lines. Organizationally, the segments are organized in double-segment pairs.

Figure 3:
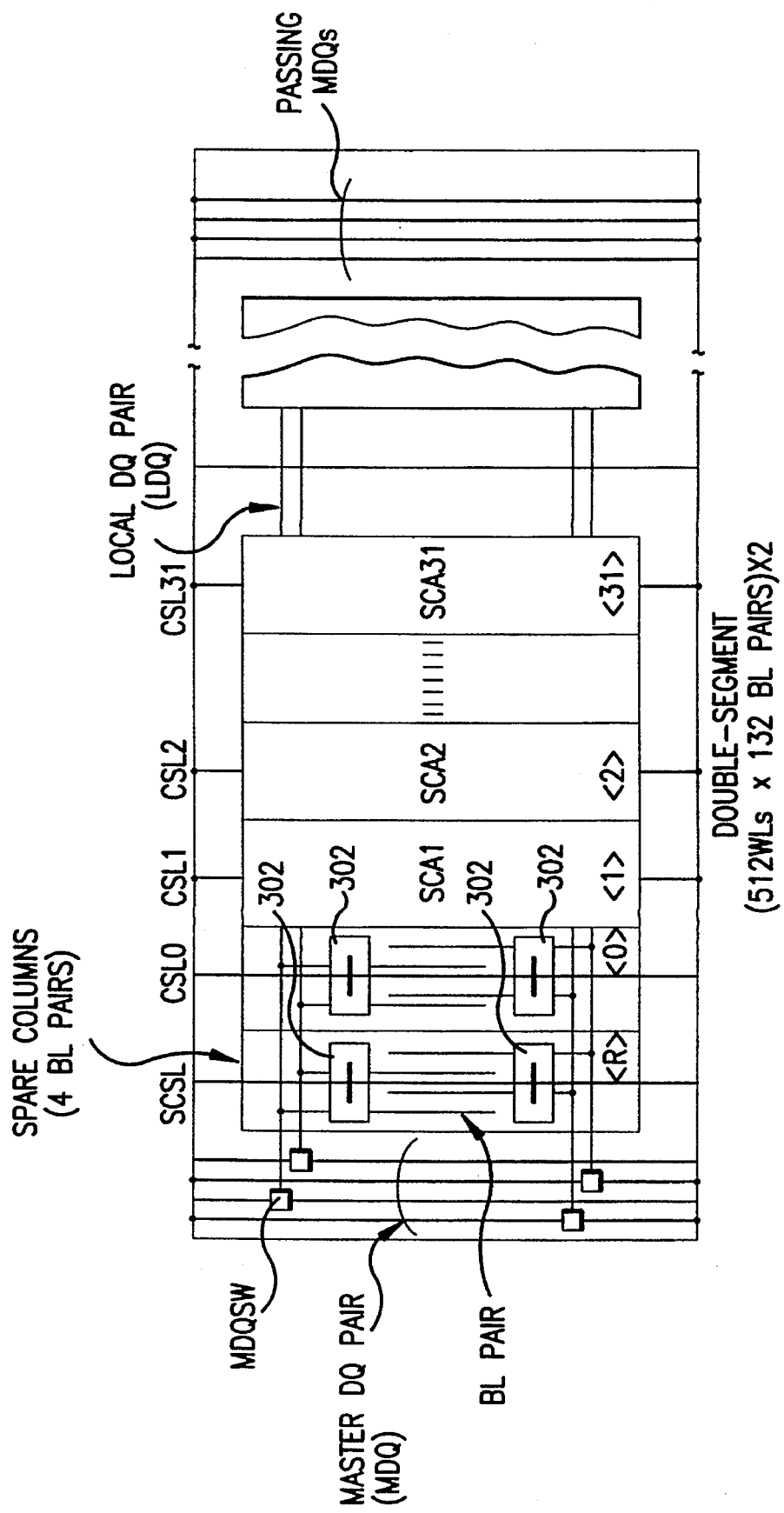
FIG. 3 is a block diagram of double segment circuitry.

FIG. 3 is a blocked diagram of a double-segment pair. A first segment (depicted on the left hand side of FIG. 3) is illustrated in detail, and a second segment (depicted on the right hand side of FIG. 3) is substantially a mirror image of the first segment. The first segment include 32 segment cell array circuits, denoted SCA 0 through SCA 31 plus a spare cell array circuit. Each cell array circuit is organized around an architecture having 512 word lines and four bit line pairs. Each cell array circuit stores 2048 bits. Each segment stores 65,536 bits plus 2048 spare bits. Each segment pair stores 131,072 bits plus 4096 spare bits.

Each segment cell array circuit includes four sense amplifiers, although the sense amplifiers maybe shared with adjacent cell arrays in different blocks (see FIG. 1) as will described hereinafter. Each sense amplifier 302 is associated with a corresponding bit line pair. It will be appreciated by persons of ordinary skill in the art that the segment cell array circuit may in fact be based on a technology using line pairs, or single ended bit lines. Each sense amp is selectively connectable to a local data bus designated LDQ. The local data bus extends through each of the segment cell array circuits in both segments of the double segment pair. However, only the segment cell array circuit which is selected by a column select line (e.g., CSL 0 through CSL 31 or spare SCSL) in either segment is permitted to transfer data between local data bus LDQ and the sense amplifiers of the selected segment cell array circuit. This function will be described in greater detail with respect to FIGS. 4–7.

Each double segment pair includes a master data bus extending in a direction transverse to local data bus LDQ and having 8 master data lines. It will appreciate that a data line preferably includes a complimentary pair of wires. In this exemplary embodiment, four of the master data lines are designated "passing" master data lines and are not connectable to any local data lines LDQ of the present double segment pair. The other four master data lines are selectively connectable through master data line switches MDQSW to the four local data lines (i.e., LDQs).

In this example, each segment of the 16 segments in a block (see FIG. 2) includes a set of four master data lines. The set of four master data lines extends through corresponding segments in each block of the 16 blocks depicted in FIG. 1. In a double segment slice including a double segment pair for each of the 16 blocked (FIG. 1), each double segment pair includes two sets of four master data lines extending through the 16 blocks depicted in FIG. 1. In the double segment slice, eight of the 16 blocks have a double segment pair with a local data bus selectively connectable to only one of the sets of four master data lines while the other eight of the 16 blocks have a double segment pair with a local data bus selectively connectable to the other set of four master data lines.

For purposes of discussion with respect to FIGS. 10–15, a segment will be described as if it includes two sets of two master data lines each, the local data bus of the segment being selectively connectable to only one of the sets. It will appreciated by persons skilled in the art that a single segment with two sets of two master data lines each is equivalent to a double segment pair having two sets of master data lines where each set has four master data lines, and is in turn equivalent to a quad segment group having two sets of master data lines where each set has eight data lines, etc.

Figure 4:
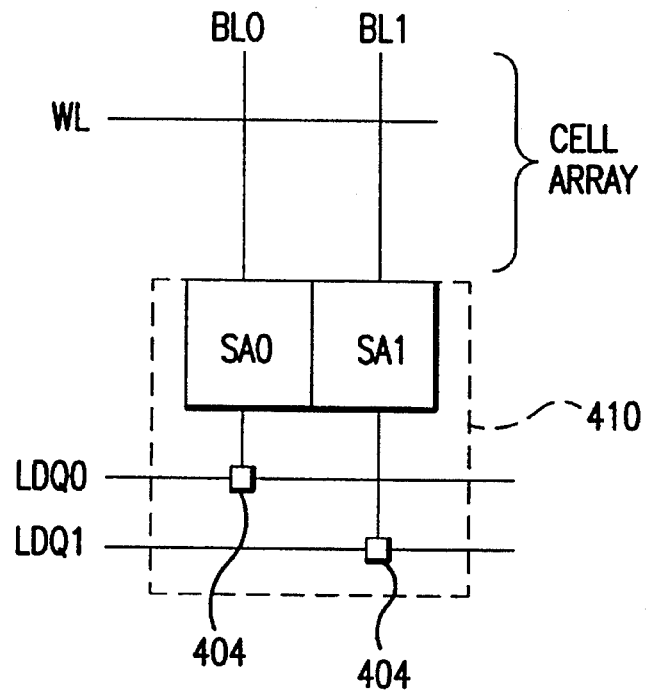
FIG. 4 is a schematic diagram of a segment cell array circuit with a single sided sense amplifier row without sharing sense amplifiers between adjacent cell arrays.

FIGS. 4–7 describe alternative embodiments of sense amplifier organizations. FIG. 4 is a schematic diagram of a segment cell array circuit with a single sided sense amplifier row which does not share sense amplifiers between adjacent cell arrays. The cell arrays is delined by a plurality of word lines collectively designated WL and a plurality of bit lines designated in FIG. 4 as BL0 and BL1. There is one sense amplifier corresponding to each bit line. When the word line is operated, signals on the bit lines are sensed in the sense amplifiers. A column switch is provided at the output of each sense amplifier to selectively couple the sense amplifier to the local data bus. Column switches 404 are provided for this purpose. Sense amplifier row 410 includes the sense amplifiers and column select switches 404. The local data bus (i.e., LDQ0 and LDQ1) extends through sense amplifier row 410. It will be appreciated that the segment cell array depicted in FIG. 4 can be replicated so that additional cell arrays and sense amplifiers rows are concatenated along the local data bus. In the segment cell array circuit depicted in FIG. 4 both switches 404 may connect signals on a local data bus with corresponding sense amplifiers while corresponding switches 404 in adjacent segment cell array circuits (not shown) prevent connection between the local data bus and their sense amplifiers. Only the selected segment cell array circuit is permitted to exchange signals between sense amplifiers and the local data bus. It will be appreciated that this exchange is two way in nature so that signals on a local data bus may be set into the sense amplifiers, and signals from the sense amplifiers may be transferred to the local data bus. The segment cell array circuit depicted in FIG. 4 is said to have a single sided sense amplifier row sense amplifier row 410 is disposed on only one side of the cell array.

Figure 5:
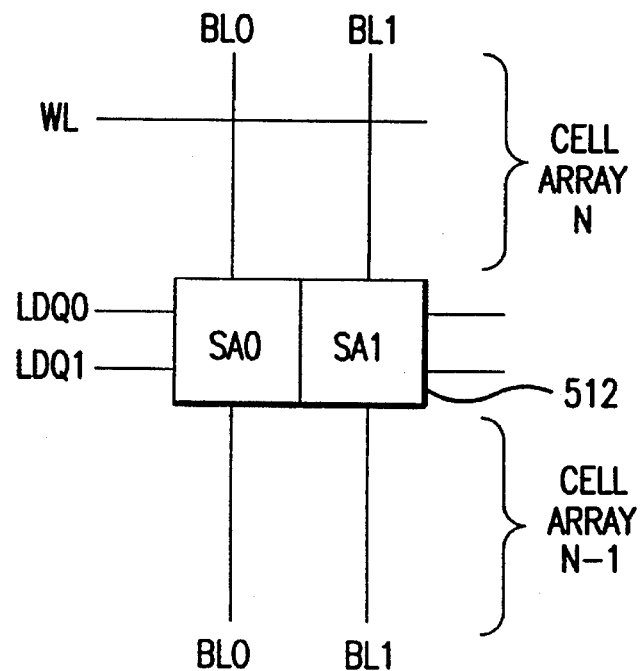
FIG. 5 is a schematic diagram of a segment cell array circuit with a single sided sense amplifier row shared between adjacent cell arrays.

FIG. 5 shows a blocked diagram of a segment cell array circuit with a single sense amplifier row shared between adjacent cell arrays. In FIG. 5, sense amplifier row 512 is shared between cell array N and cell array N-1. Sense amplifier row 512 preferably includes a multiplexer or isolator to selectively transfer signals from either cell array N or cell array N-1, but not both, to the sense amplifiers. As in FIG. 4, the local data bus (i.e., LDQ0 and LDQ1) of FIG. 5 extends through sense amplifiers row 512 so that the segment cell array circuit depicted in FIG. 5 maybe concatenated with other segment cell array circuits. The advantage of the circuit of FIG. 5 over the circuit of FIG. 4 is a single sense amplifier row may serve two adjacent cell arrays, the additional multiplexer/isolator being nominal in size compared to the area required for an extra sense amplifier row.

Figure 6:
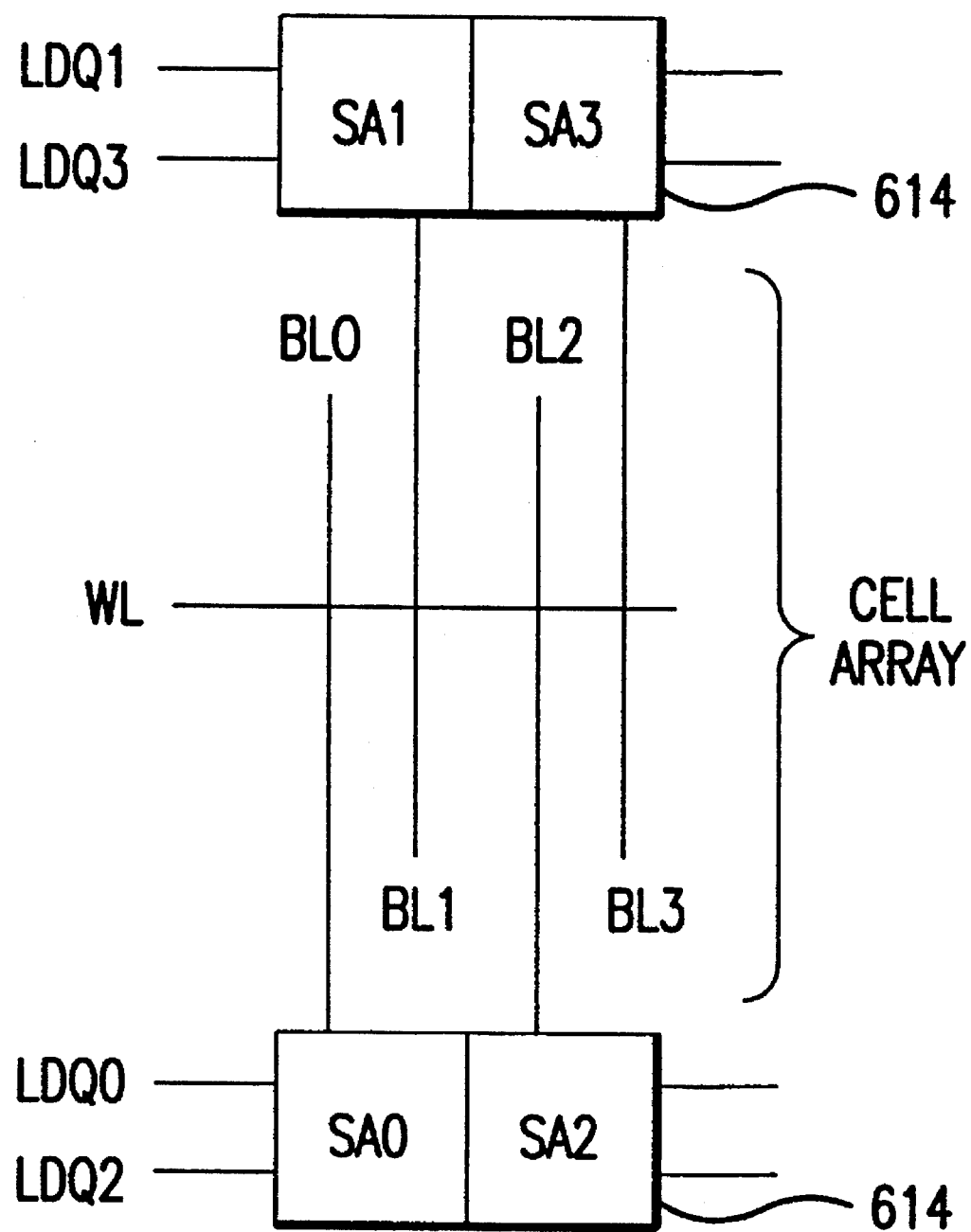
FIG. 6 is a schematic diagram of a segment cell array circuit with a two sided sense amplifier row without sharing sense amplifiers between adjacent cell arrays.

FIG. 6 shows a schematic diagram of a segment cell array circuit with a two sided sense amplifier row without sharing sense amplifiers between adjacent cell arrays. In this figure the cell array includes two sense amplifier rows 614 on either side of the cell array. The bit lines (e.g., BL0–BL3) are alternately connected to the first sense amplifier row and then the second sense amplifier row in an interdigitated manner. The bit lines (e.g., BL0–BL3) have a pitch which is twice as dense as the pitch of either sense amplifier row. In advanced memory designs, this provides a better match between the area requirement of a memory cell and the area requirement of a sense amplifier. In FIG. 6, the word line is operated to produce signals on bit lines BL0-BL3, which signals are set in the sense amplifiers and are selectively connectable to the local data bus (i.e., LDQ0–LDQ3). It will be appreciated that means for selectively connecting the sense amplifier to the local data bus is the same as switches 404 depicted in FIG. 4. An advantage of the circuit depicted in FIG. 6 over the circuit depicted in FIG. 4 includes obtaining overall higher density memory storage since the interdigitated bit line structure associated with the two sided sense amplifier row better matches the physical area required for a memory cell and the physical area required for a sense amplifier.

Figure 7:
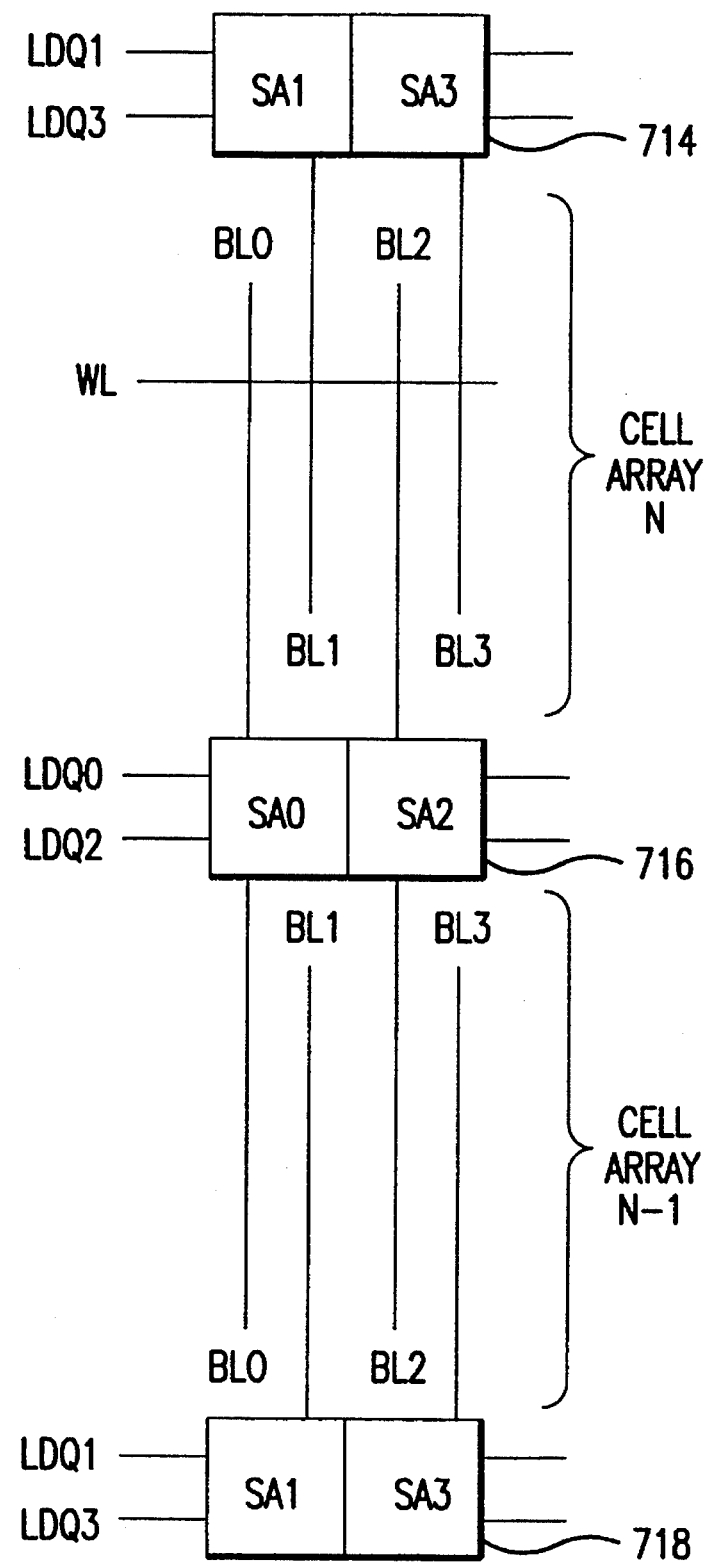
FIG. 7 is a schematic diagram of a segment cell array circuit with a two sided sense amplifier row shared between adjacent cell arrays.

FIG. 7 shows a schematic diagram of a segment cell array circuit with a two sided sense amplifier row shared between adjacent cell arrays. In particular, sense amplifier row 716 serves both cell array N and cell array N-1, whereas sense amplifier row 714 serves only cell array N, and sense amplifier row 718 serves only cell array N-1. Sense amplifier row 714, sense amplifier row 716 and cell array N dispose therebetween form a double sided sense amplifier about cell array N. Similarly, sense amplifier row 716, sense amplifier row 718 and cell array N-1 form a double sided sense amplifier about cell array N-1. The circuit depicted in FIG. 7 includes the advantages of the pitch improvement of the circuit of FIG. 6 over the circuit of FIG. 4 and includes the area advantage of the circuit depicted in FIG. 5 over the circuit depicted in FIG. 4.

Figure 8:
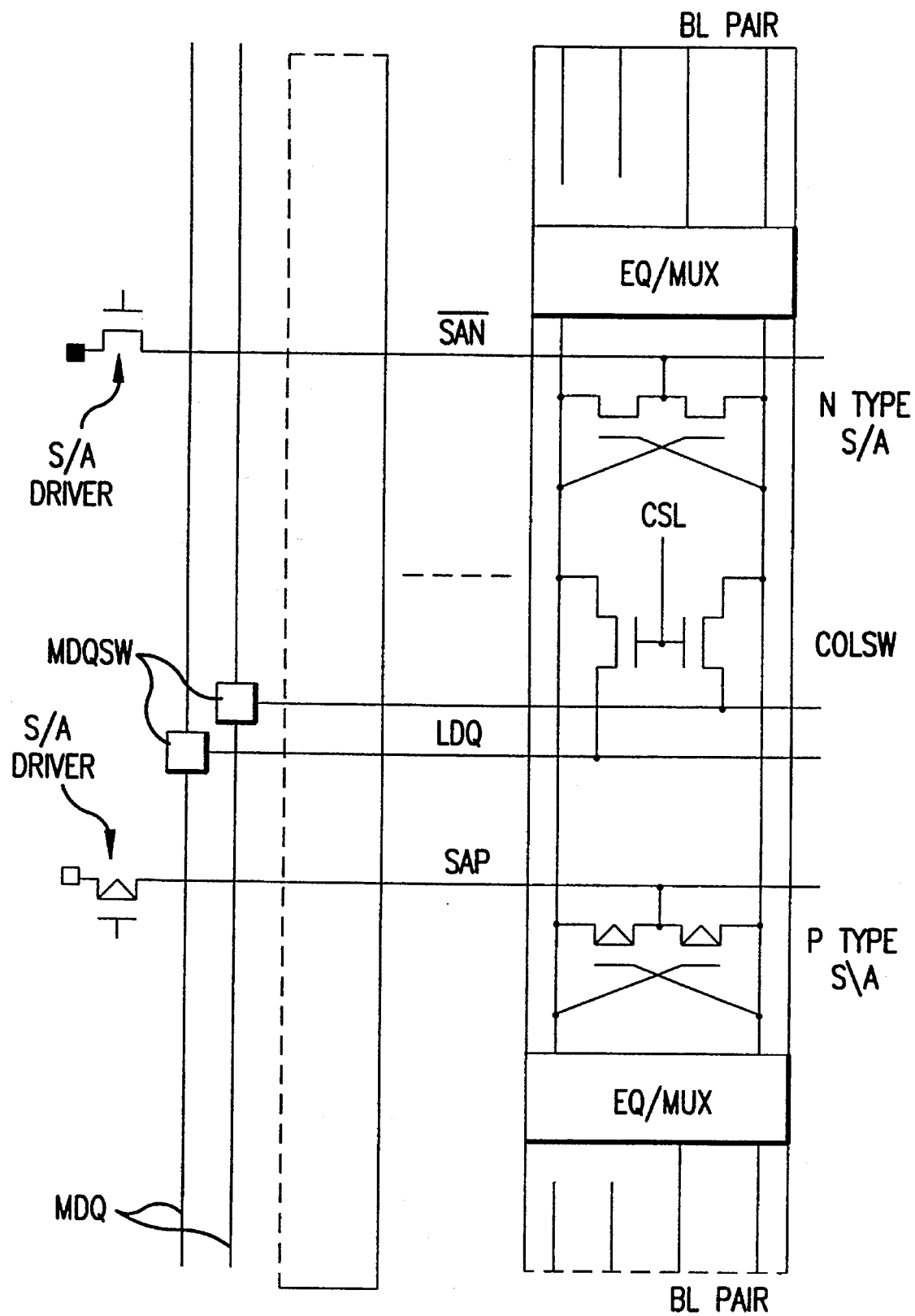
FIG. 8 is a circuit schematic diagram of a two sided shared sense amplifier and master data line switch connecting local data bus to master data bus.
Figure 9:
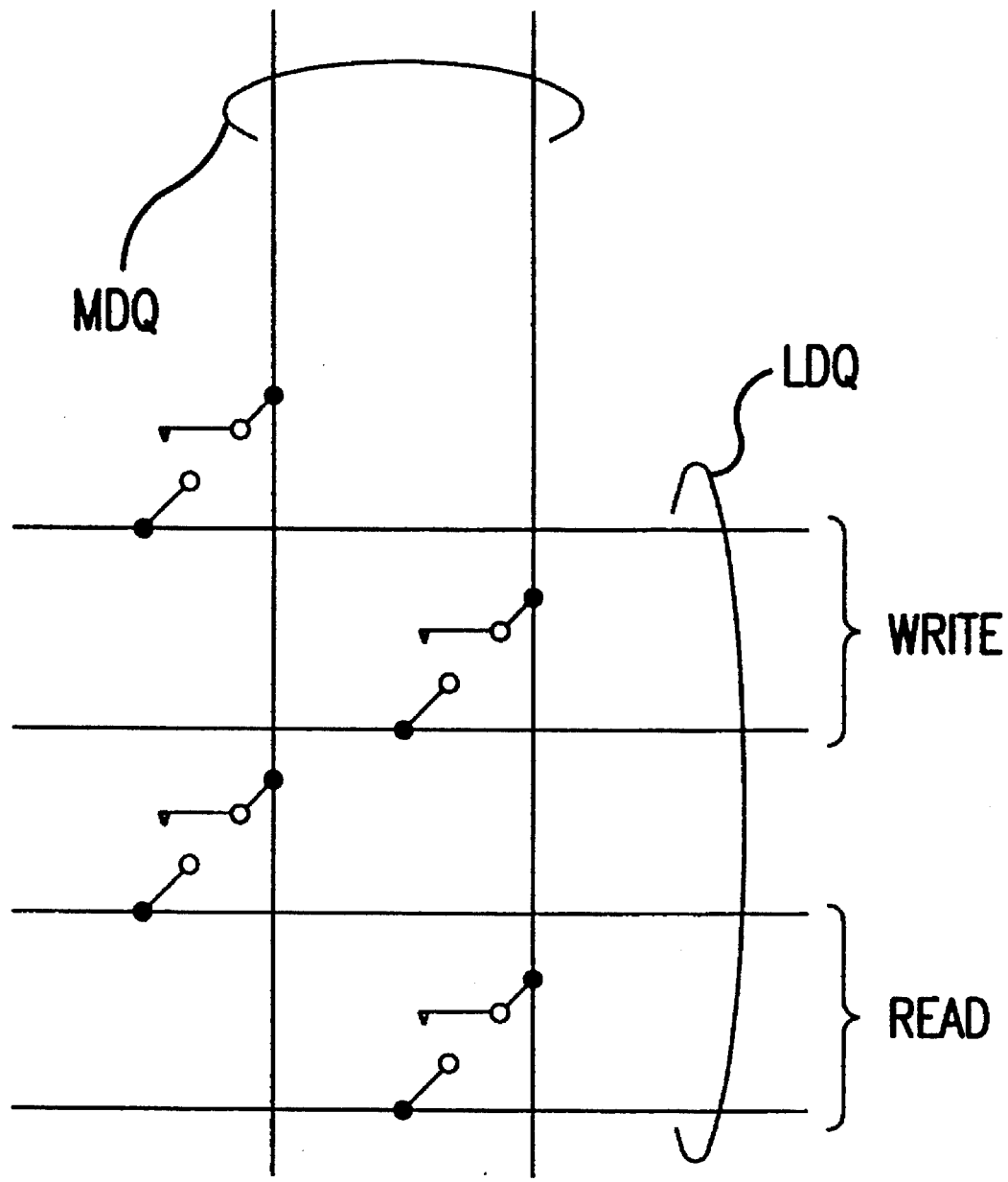
FIG. 9 is a functional schematic diagram of alternative switch connecting a local data bus to a master data bus.

FIG. 8 shows a circuit schematic of a two sided shared sense amplifier and master data bus switch MDQSW connecting local data line LDQ to master data line MDQ. Local data line LDQ depicted in FIG. 8 is a single line having complimentary signal carrying wires. Similarly master data line MDQ is a single line having complimentary signal carrying wires. Master data line switch MDQSW includes two switches, preferably MOS type transistor switches, connecting respective complimentary wires of local data line LDQ to master data line MDQ. Alternatively, should the design require it, local data line LDQ may be designed with separate read and write operations, thus having four wires (e.g., see FIG. 9).

Figure 16:
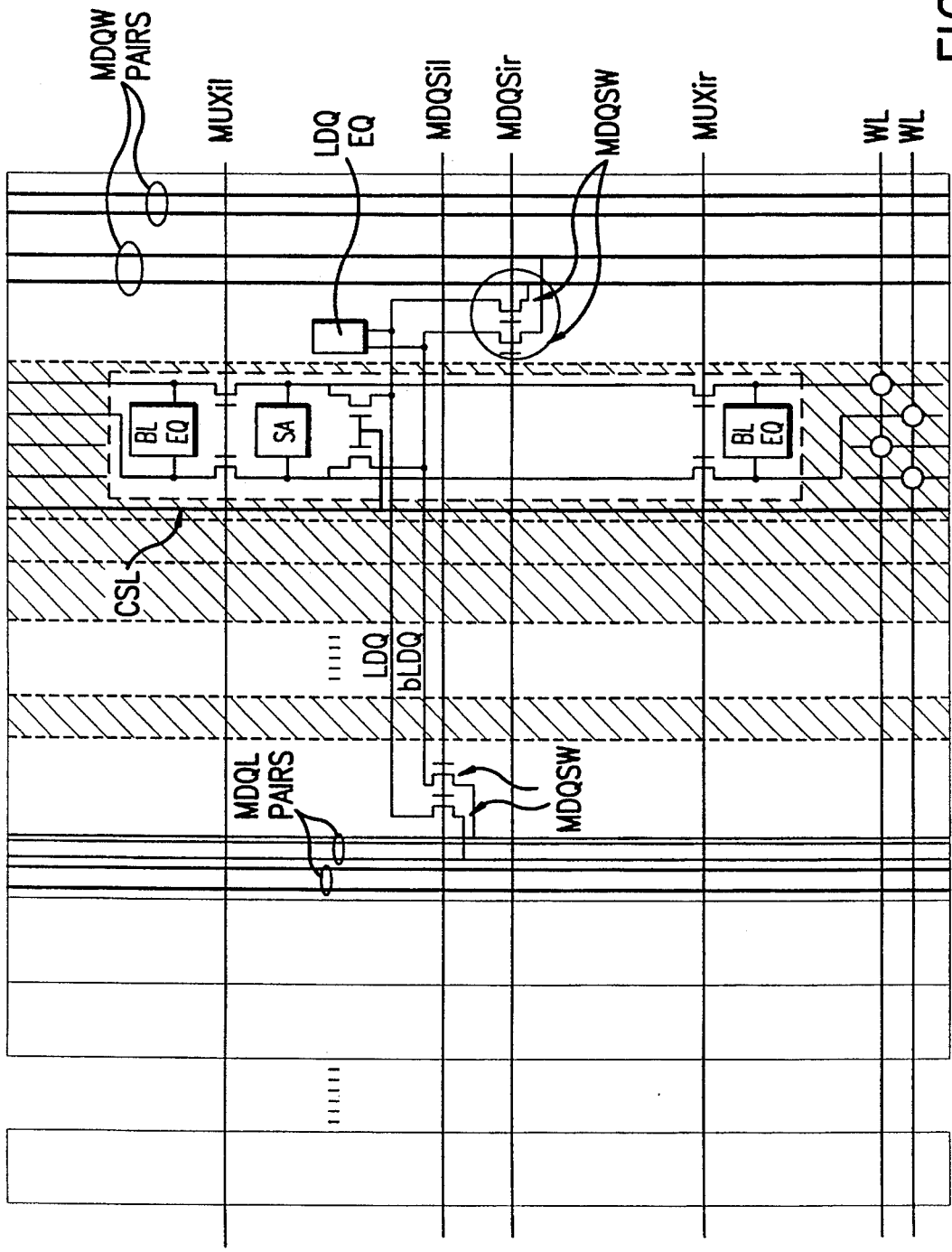
FIG. 16 is a circuit schematic of connecting means with exchangeable hierarchical data line structure.
Figure 17:
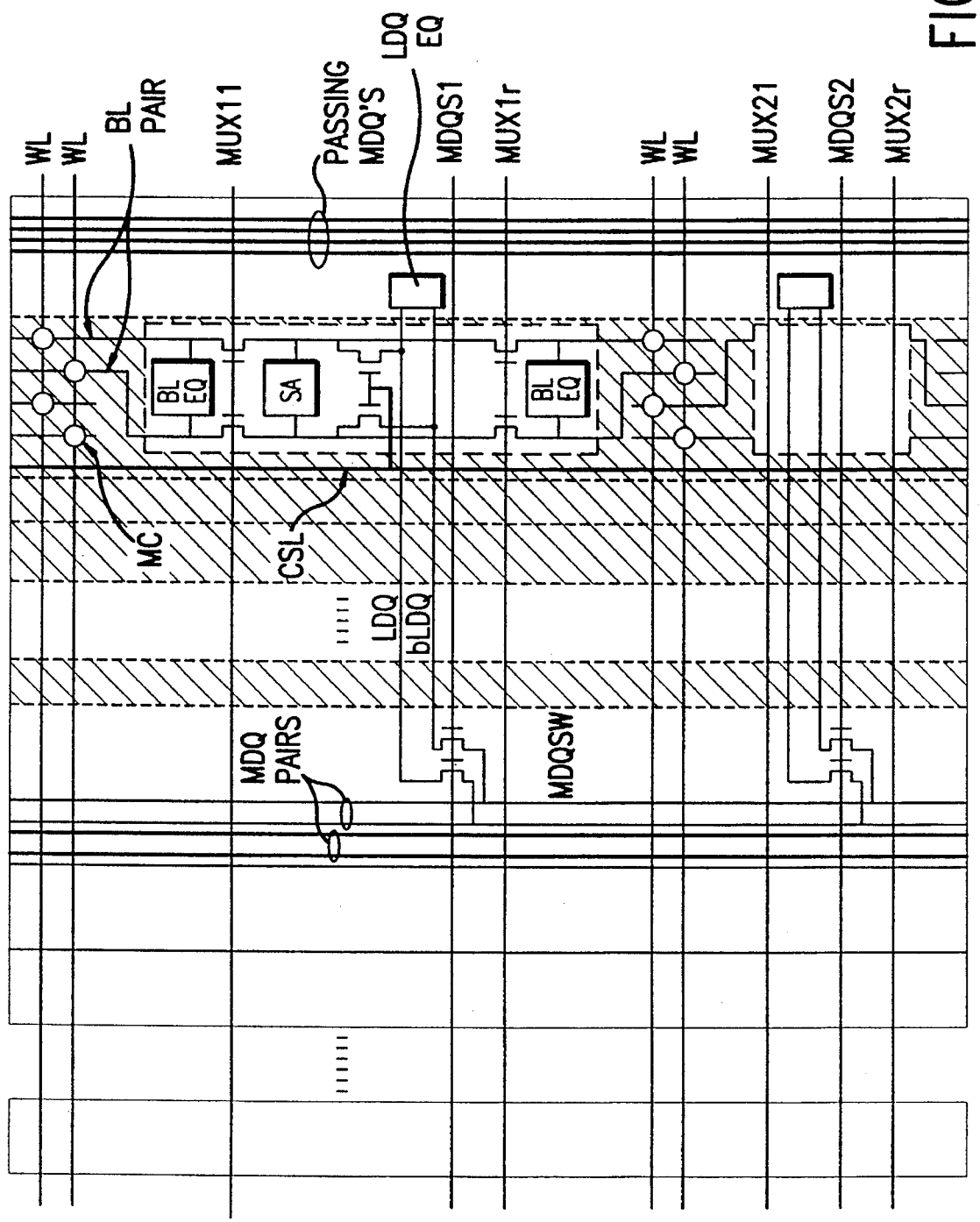
FIG. 17 is a circuit schematic of connecting means without an exchangeable hierarchical data line structure.

The sense amplifier includes an N type sense amplifier portion and a P type sense amplifier portion. The N type sense amplifier portion is controlled by signal/SAN driven by a sense amplifier driver, and the P type sense amplifier portion is controlled by signal SAP driven by a sense amplifier driver. Together the N and P type sense amplifier portions form a latching sense amplifier circuit. The latched signals on the sense amplifier may be transferred to local data line LDQ through column select switch COLSW. Column select switch COLSW is controlled by column select signal CSL (e.g., a signal corresponding to CSL0 through CSL31 in FIG. 3). Column select switch COLSW depicted in FIG. 8 correspond to switch 404 depicted in FIG. 4. A two transistor switch is required to transfer complimentary signals comprising the data line. The latching sense amplifier is connected to bit line pairs through one of two equalizer/multiplexer circuits, each disposed next to the N type sense amplifier portion and the P type sense amplifier portion, respectively. The multiplexer portion of this circuit may include merely a pair of switching transistors, each connected in series in each of the two complimentary single lines as shown in FIG. 16 or FIG. 17. In FIG. 16 a first multiplexer is controlled by signal MUXil and a second multiplexer is controlled by signal MUXir. In FIG. 16, the bit line equalizer is shown functionally as a block shunting across the two complimentary bit lines of a bit line pair. Conventionally, such a bit line equalizer is a single shunting switch transistor or perhaps a pair of shunting transistors connected in series to shunt across the wires of the bit line pair.

In FIG. 8 there is shown two pairs of bit lines connected to respective ones of the two equalizer/multiplexers EQ/MUX. There is also shown two pairs of unconnected bit lines disposed adjacent to the bit line pairs connected to the equalizer/multiplexers indicating that the sense amplifier circuit of FIG. 8 is intended to be a two sided sense amplifier circuit shared between adjacent cell arrays as described with respect to FIG. 7.

Figure 10:
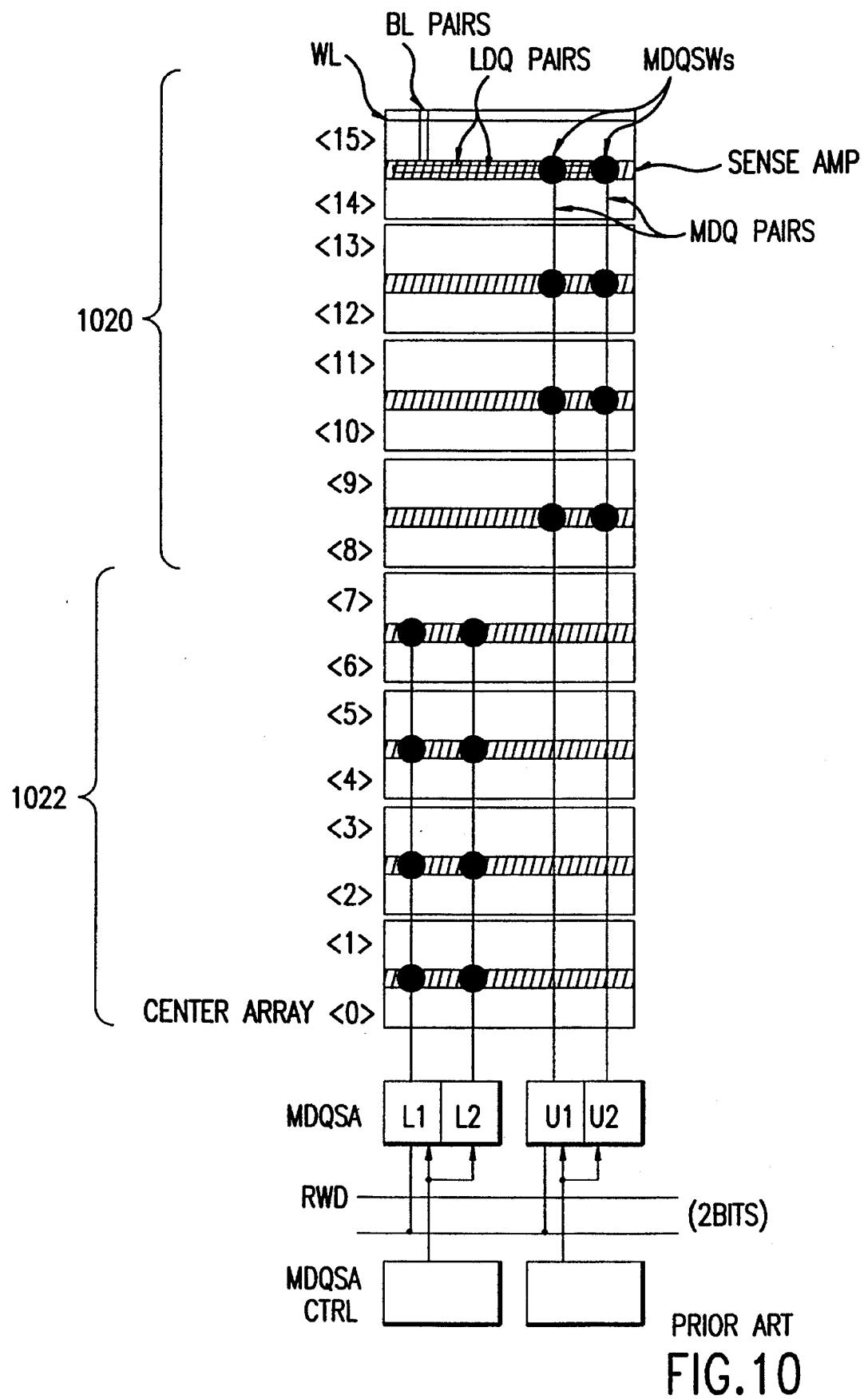
FIG. 10 is a block diagram of a segment slice of unit circuitry without any redundancy blocks and using single sided sense amplifiers.

FIG. 10 shows a block diagram of a segment slice of unit circuity without any redundancy blocks. The segment slice uses only single sided sense amplifiers. This approach is conventional in that it does not use the exchangeable hierarchical data line structure of the present invention. The segment slice is assumed to be a single segment (e.g., see FIG. 2 or FIG. 3) from each of the blocks of the unit circuit depicted in FIG. 1. For simplicity, assume that each segment includes a data bus having two sets of master data lines, each set of master data lines having two data lines, one set of master data lines being selectively connectable to the local data bus of the segment and the other set being a "passing" set of master data lines. For the reasons discussed hereinabove, this assumption is equivalent to the double segment pair shown in FIG. 3.

In FIG. 10, word line circuit WL operates a word line in cell array 15 which produces corresponding signals on two bit line pairs. The signals on the two bit line pairs are sensed in a pair of sense amplifiers selectively connectable to local data bus LDQ. For example, see FIG. 4 for a single sided sense amplifier row having two sense amplifiers capable of sensing signals on two bit line pairs and selectively connecting these signals to the local data bus. However, in FIG. 10, the sense amplifier row includes more than a single pair of sense amplifiers. In fact, it includes 64 pairs of sense amplifiers (i.e., 128 sense amplifiers) as depicted in FIG. 4 at 410 plus two spare pairs of sense amplifiers (i.e., four spare sense amplifiers). Column select signals (e.g., signals such as CSL0 through CSL31 and SCSL of FIG. 3) selectively connect only one pair of amplifiers through switches (e.g., switches 404 of FIG. 4) to the local data bus. In FIG. 10, master data bus switches MDQSW selectively couple the two bit line pairs selected by column select signal to two of the master data line pairs MDQ. The signals on the master data lines are transferred to master data line sense amplifier MDQSA where they are relatched and selectively transferred onto read/write data bus RWD according to master data line sense amplifier controller MDQSA CTRL.

To save area on the integrated circuit of the DRAM, the sense amplifiers are shared between adjacent cell arrays. For example, cell array 14 and 15 share the same sense amplifiers. Similarly cell arrays 12 and 13 share the same sense amplifiers, cell arrays 10 and 11 share the same amplifiers, etc.

In FIG. 10, cell array <0> through cell array <7> are selectively connected to a first set of master data lines through switches depicted as black dots and cell array <8> through <15> are selectively connected to a second set of master data lines through other switches. In operation, cell array <i> and cell array <i+8>, where i may be any cell array from 0 to 7, are operated simultaneously. Signals from two bit line pairs in each of two different cell arrays are simultaneously accessed and placed in master data line sense amplifiers MDQSA. There are four such master sense amplifiers. However, only two of the master data line sense amplifiers are connected, at any one time, to read/write data bus RWD according to control signals from the master data line sense amplifier controller MDQSA CTRL. The controller provides that signals from either first half 1020 of the cell arrays of the segment slice of the unit circuit or second half 1022 of the cell arrays of the segment slice of the unit circuit is provided on read/write data bus RWD at any one time. Such a circuit arrangement is able to realize a wide I/O organization and alternatively be operated for an efficient data compression test mode (i.e., both first half 1020 and the second half 1022 are operated simultaneously). Although the circuit according to FIG. 10 is capable of providing efficient use of integrated circuit area based on shared sense amplifiers operated in accordance with the description of the circuit of FIG. 5, it is unable to provide the efficient use of the integrated circuit area based on two sided sense amplifiers shared between adjacent cells described with respect to FIG. 7.

Figure 11:
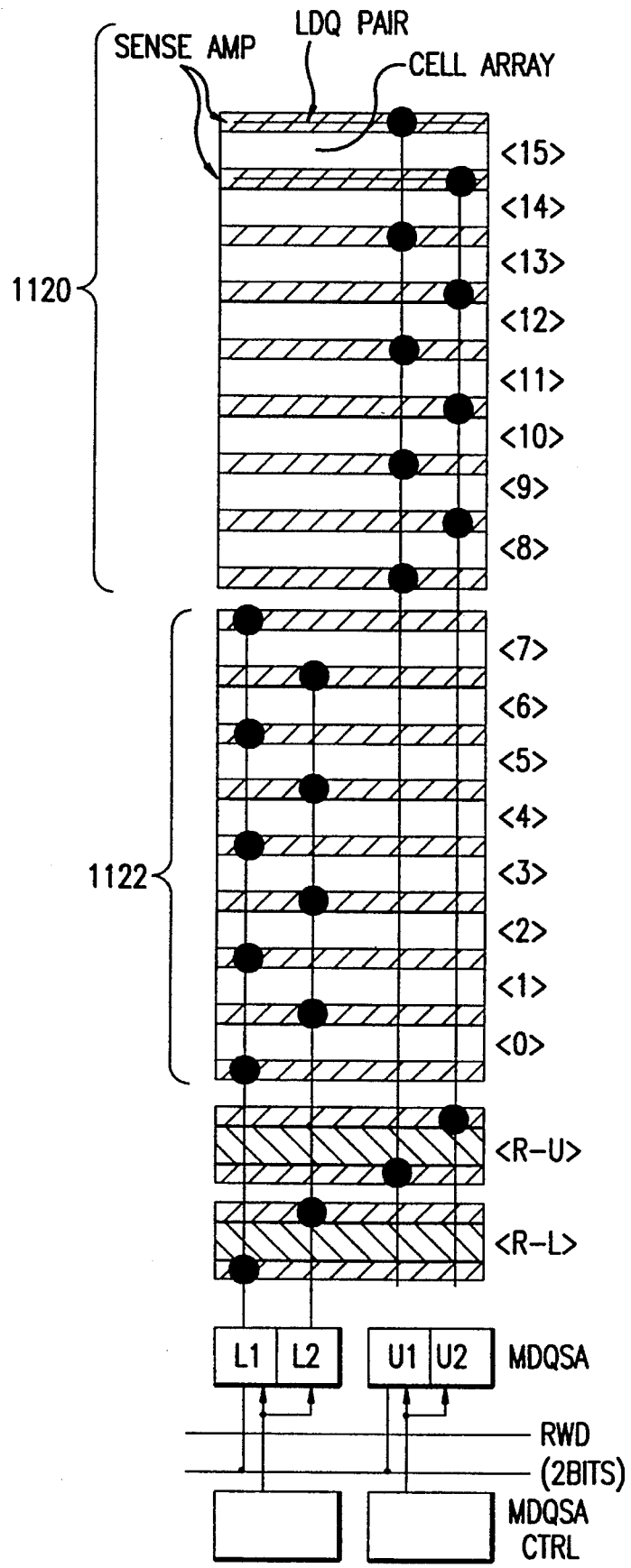
FIG. 11 is a block diagram of a segment slice of unit circuitry with two redundancy blocks using two sided sense amplifiers.

FIG. 11 is block diagram of a segment slice of a unit circuit with two redundancy blocks using two sided sense amplifiers with some of the sense amplifiers shared between adjacent cell arrays (e.g., according to the circuit of FIG. 7). In order to maintain a two block activation capability for the circuit of FIG. 11, it is necessary to maintain separate organizations for first half 1120 and second half 1122. Thus, the number of sense amplifier rows for the sixteen cell arrays is 18, nine sense amplifier rows for each half of the unit circuit. Similarly, in order to provide for redundancy blocks (i.e., spare blocks to provide replacement memory cells when a regular word line circuit is defective) it is likewise necessary to maintain two separate redundancy blocks requiting four rows of sense amplifiers.

Figure 14:
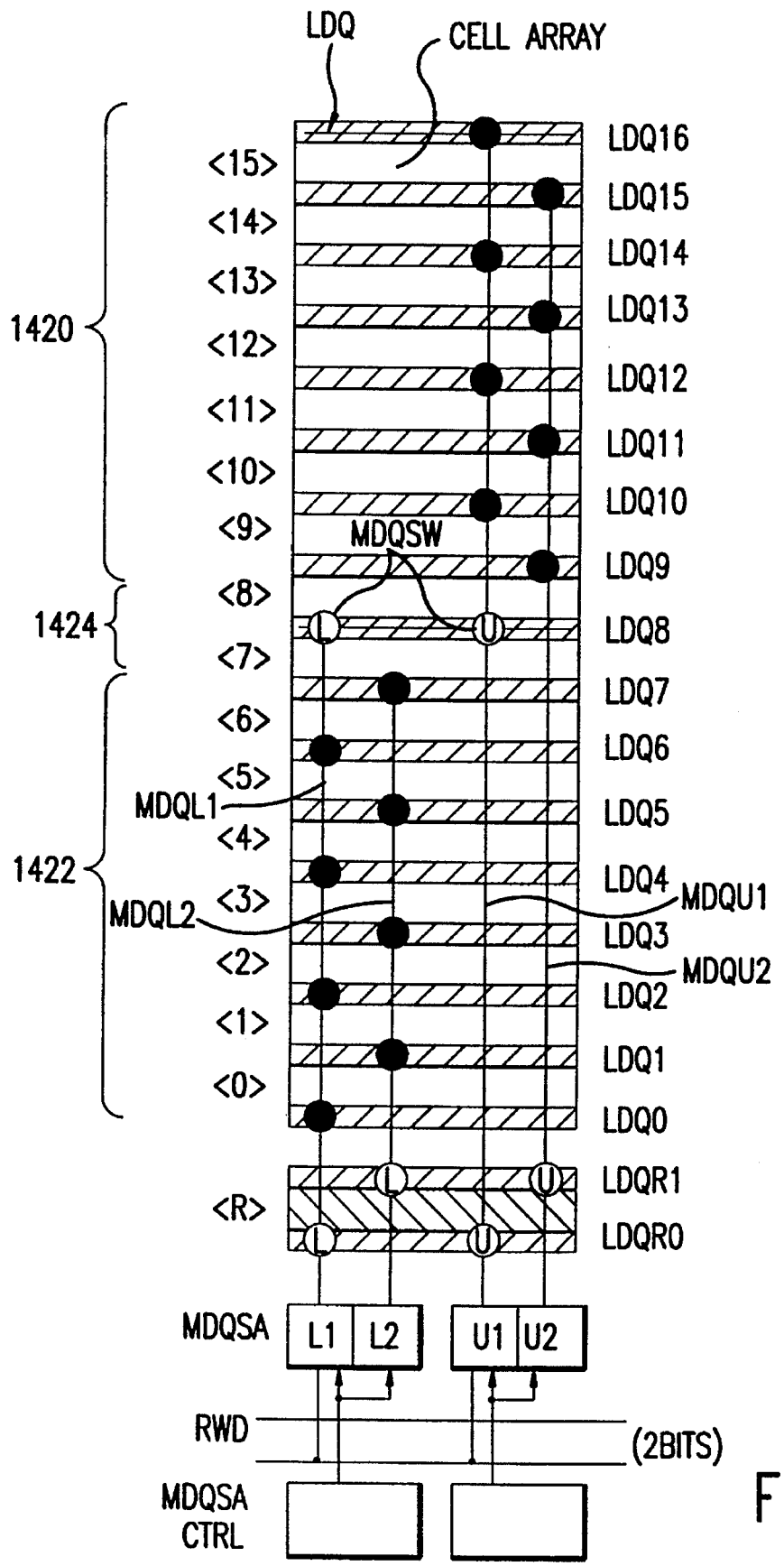
FIG. 14 is a block diagram of a segment slice of unit circuitry with a redundancy cell array block and exchangeable hierarchical data line structure.

In order to reduce the area acquired on the integrated circuit of the DRAM, it is desirable to reduce the number of sense amplifier rows required. For example, FIG. 14 shows an exchangeable hierarchical data line structure used for the sense amplifier row disposed between cell array <7> and cell array <8> eliminating a sense amplifier row. Furthermore, the exchangeable hierarchical data line structure enables to the elimination of two sense amplifier rows and one cell array in the redundant cell arrays.

Figure 12:
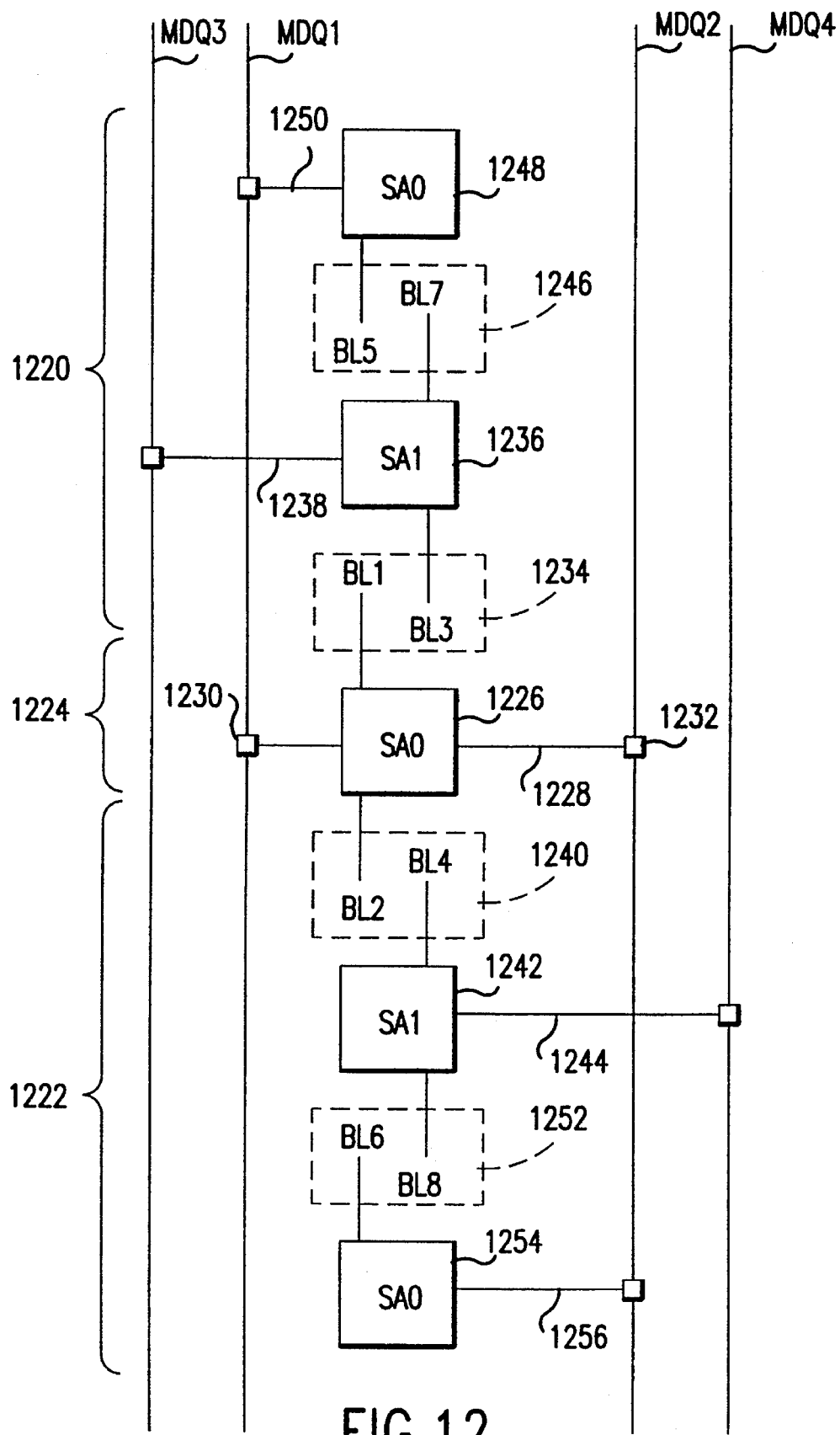
FIG. 12 is a block diagram of a segment slice of four cell array blocks of unit circuitry with exchangeable hierarchical data line structure.
Figure 13:
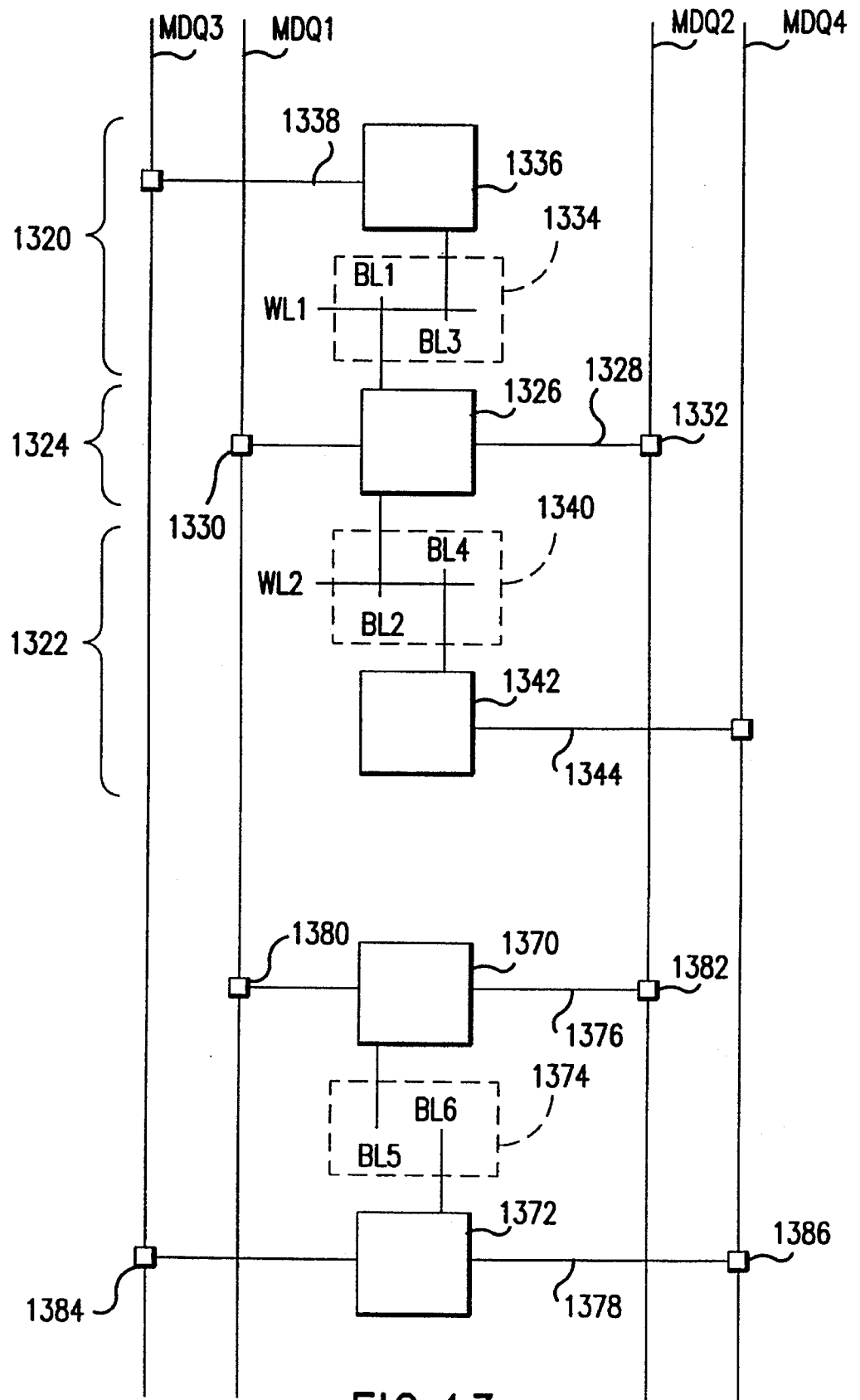
FIG. 13 is a block diagram of a segment slice of two cell array blocks and a redundancy cell array block of unit circuitry with exchangeable hierarchical data line structure.

FIGS. 12 and 13 illustrate the principals of the exchangeable hierarchical data line structure. FIG. 12 is a block diagram of a segment slice of four cell array blocks of unit circuity with exchangeable hierarchical data line structure. This circuit includes first half 1220, second half 1222 and a common sense amplifier row 1224 disposed therebetween. The common sense amplifier row includes a common plurality of sense amplifiers 1226 and a common local data line 1228. The segment slice depicted in FIG. 12 includes a first set of master data lines with first master data line MDQ 1 and third master data line MDQ3, and a second set of master data lines with second master data line MDQ2 and fourth master data line MDQ4. The master data lines form a master bus transversing the direction of common local data line 1228. It will be appreciated that multiple segment slices may be concatenated in parallel so that common local data line 1228 will operate in parallel with additional common local data lines to form a common local data bus.

The circuit in FIG. 12 includes first switch circuitry 1230 to selectively couple signals between common local data line 1228 and first master data line MDQ 1. The circuit of FIG. 12 further includes second switch circuitry 1232 to selectively couple signals between common local data line 1228 and second master data line MDQ2.

In operation a signal on common local data line 1228 is couplable to the first master data line MDQ1 when the signal on common local data line 1228 is not coupled to second master data line MDQ2. Furthermore, the signal on common data line 1228 is couplable to second master data line MDQ2 when the signal on common local data line 1228 is not coupled to first master data line MDQ1. In this way an exchange can be made between sense amplifier 1226 servicing master data line MDQ1 and alternatively servicing master data line MDQ2. In this way, a single shared sense amplifier row may serve all necessary functions in the circuit depicted in FIG. 14.

The first half 1220 of the unit circuit includes first cell array 1234 and first plurality of sense amplifiers 1236, first cell array 1234 including first bit line BL1 connected to sense amplifier 1226. The first plurality of sense amplifiers includes a first local data bus extending therethrough, the first data bus including first local data line 1238. A signal on first local data line 1238 is selectively couplable to third master data line MDQ3.

The second half 1222 of the unit circuit includes second cell array 1240 and second plurality of sense amplifiers 1242, the second cell array 1240 including second bit line BL2 connected to shared sense amplifier 1226. Second plurality of sense amplifiers 1242 includes a second local bus extending therethrough, the second local data bus including second local data line 1244. A signal on second local data line 1244 is selectively couplable to fourth master data line MDQ4.

In operation, shared sense amplifier 1226 is used to support either first cell array 1234 or second cell array 1240, but not both simultaneously. When switch circuitry 1230 couples common local data line 1228 to first master data line MDQ1, shared sense amplifier 1226 is used to support operations of first cell array 1234. When switch circuitry 1232 couples common local data line 1228 to second master data line MDQ2, shared sense amplifier 1226 is used to support operations of second cell array 1240.

First cell array 1234 is disposed between common plurality of sense amplifiers 1226 and first plurality of sense amplifiers of 1236 to form a double sided sense amplifiers about first cell array 1234 when the signal on common data line 1228 is coupled to first master data line MDQ1. The first cell array further includes third bit line BL3 connected to first sense amplifier 1236. Signals on the first and third bit lines BL1 and BL3 are coupled to first and third master data lines MDQ1 and MDQ3 when the signal on common local data line 1228 is coupled to first master data line MDQ1.

Second cell array 1240 is disposed between common plurality of sense amplifiers 1226 and second plurality of sense amplifiers of 1242 to form a plurality of double sided sense amplifiers about second cell array 1240 when the signal on common local data line 1228 is coupled to second master data line MDQ2. Second cell array 1240 further includes fourth bit line BL4 connected to second sense amplifier 1242. Signals on second and fourth bit lines BL2 and BL4 are coupled to second and fourth master data lines MDQ2 and MDQ4 when the signal on common local data line 1228 is coupled to second master data line MDQ2.

First half 1220 of the unit circuit further includes third cell array 1246 and third plurality of sense amplifiers 1248, third cell array 1246 including fifth bit line BL5 connected to third sense amplifier 1248. Third plurality of sense amplifiers 1248 includes third local data bus extending therethrough, the third local data bus including third local data line 1250. A signal on third local data line 1250 is selectively couplable to first master data line MDQ1.

Second half 1222 of the unit further includes fourth cell array 1252 and fourth plurality of sense amplifiers 1254, fourth cell array 1252 including sixth bit line BL6 connected to fourth plurality of sense amplifiers 1254. Fourth plurality of sense amplifiers 1254 includes fourth local data bus extending therethrough, the fourth local data bus including a fourth local data line 1256. A signal on fourth local data line 1256 is selectively couplable to the second master data line MDQ2.

Third cell array 1246 is disposed between first plurality of sense amplifiers 1236 and third plurality of sense amplifiers 1248 to form a plurality of double sided sense amplifiers about third cell array 1246 when the signal on common local data line 1228 is coupled to second master data line MDQ2. Third cell array 1246 further includes seventh bit line BL7 connected to first sense amplifier 1236. Signals on fifth and seventh bit lines BL5 and BL7 are coupled to first and third master data lines, MDQ1 and MDQ3, when the signal on common local data line 1228 is coupled to second master data line MDQ2.

Fourth cell array 1252 is disposed between second plurality of sense amplifiers 1242 and fourth plurality of sense amplifiers 1254 to form a plurality of double sided sense amplifiers about fourth cell array 1252 when the signal on common local data line 1228 is coupled to first master data line MDQ1. The fourth cell array further includes eighth bit line BL8 connected to second sense amplifier 1242. Signals on sixth and eighth bit lines BL6 and BL8 are coupled to second and fourth master data lines, MDQ2 and MDQ4, when the signal on common local data line 1228 is coupled to the first master data line MDQ1.

FIG. 13 depicts a block diagram of a segment slice of two cell array blocks and a redundancy cell array block of unit circuitry with exchangeable hierarchical data line structure. As explained in portions of this specification referring to FIG. 12, the memory has a master data bus having first, second, third and fourth master data lines MDQ1, MDQ2, MDQ3 and MDQ4. The memory further has first half 1320 of the unit, second half 1322 of the unit and common sense amplifier row 1324 disposed therebetween. Sense amplifier row 1324 includes common plurality of sense amplifiers 1326 and a common local data bus extending therethrough, the common local data bus including common local data line 1328. The circuit of FIG. 13 includes first switch circuitry 1330 to selectively couple signals between common local data line 1328 and first master data line MDQ1. The circuit of FIG. 13 further includes second switch circuitry 1332 to selectively couple signals between common local data line 1328 and second master data line MDQ2. A signal on common local data line 1328 is selectively couplable to first master data line MDQ1 when the signal on common local data line 1328 is not coupled to second master data line MDQ2. The signal on common local data line 1328 is selectively couplable to second master data line MDQ2 when the signal on common local data line 1328 is not coupled to first master data line MDQ1.

The circuit of FIG. 13 further includes first plurality of spare sense amplifiers 1370, second plurality of spare sense amplifiers 1372 and spare cell array 1374 disposed therebetween to form a plurality of double sided spare sense amplifiers about spare cell array 1374. First plurality of spare sense amplifiers 1370 includes a first spare local data bus extending therethrough, the first spare local data bus including a first spare local data line 1376. Second plurality of spare sense amplifiers 1372 includes a second spare local data bus extending therethrough, the second spare local data bus including a second spare local data line 1378.

The circuit of FIG. 13 further includes third switch circuitry 1380 to selectively couple signals between first spare local data line 1376 and first master data line MDQ1. The circuit of FIG. 13 further includes fourth switch circuitry 1382 to selectively couple signals between first spare local data line 1376 and second master data line MDQ2. A signal on first spare local data line 1376 is selectively couplable to first master data line MDQ1 when the signal on first spare local data line 1376 is not coupled to second master data line MDQ2. The signal on first spare local data line 1376 is selectively couplable to second master line MDQ2 when the signal on first spare local data line 1376 is not coupled to first master data line MDQ1.

The circuit of FIG. 13 further includes fifth switch circuitry 1384 to selectively couple signals between second spare local data line 1378 and third master data line MDQ3. The circuit of FIG. 13 further includes sixth switch circuitry 1386 to selectively couple signals between second spare local data line 1378 and fourth master data line MDQ4. A signal on second spare local data line 1378 is selectively couplable to third master data line MDQ3 when the signal on second spare local data line 1378 is not coupled to fourth master data line MDQ4. The signal on second spare local data line 1378 is selectively couplable to fourth master data line MDQ4 when the signal on second spare local data line 1378 is not coupled to third master data line MDQ3.

In FIG. 13, first half 1320 of the unit circuit includes first cell array 1334 and first plurality of sense amplifiers 1336, the first cell array 1344 including first bit line BL1 connected to common plurality of sense amplifiers 1326. First plurality of sense amplifiers 1336 includes a first local data bus extending therethrough, the first local data bus including first local data line 1338. A signal on first local data line 1338 is selectively couplable to third master data line MDQ3. First cell array 1334 has first word line circuit WL1 characterized as being one of operable and inoperable.

The circuit of FIG. 13 further has second half 1322 of the unit circuit which includes second cell array 1340 and second plurality of sense amplifiers 1342, second cell array 1340 including second bit line BL2 connected to common plurality of sense amplifiers 1326. Second plurality of sense amplifiers 1342 includes a second local data bus extending therethrough, the second local data bus including second local data line 1344. A signal on second local data line 1344 is selectively couplable to fourth master data line MDQ4. Second cell array 1340 has second word line circuit WL2 characterized as being one of operable and inoperable.

First cell array 1334 is disposed between common plurality of sense amplifiers 1326 and first plurality of sense amplifiers 1336 to form a plurality of double sided sense amplifiers about first cell array 1334 when the signal on common local data line 1328 is coupled to first master data line MDQ1 and first word line circuit WL1 is operable. First cell array 1334 further includes third bit line BL3 connected to first plurality of sense amplifiers 1336. Signals on first and third bit lines, BL1 and BL3, are coupled to first and third master data lines MDQ1 and MDQ3 when the signal on common local data line 1328 is coupled to first master data line MDQ1 and first word line circuit WL1 is operable.

Second cell array 1340 is disposed between common plurality of sense amplifiers 1326 and second plurality of sense amplifiers 1342 to form a plurality of double sided sense amplifiers about second cell array 1340 when the signal on common local data line 1328 is coupled to second master data line MDQ2 and second word line circuit WL2 is operable. Second cell array 1340 further includes fourth bit line BL4 connected to second plurality of sense amplifiers 1342. Signals on second and fourth bit lines, BL2 and BL4, are coupled to second and fourth master data lines, MDQ2 and MDQ4, when the signal on common local data line 1328 is coupled to second master data line MDQ2 and second word line circuit WL2 is operable.

Spare cell array 1374 includes fifth and sixth bit lines, BL5 and BL6, coupled to first spare local data line 1376 and second spare local data line 1378, respectively. Third switch circuitry 1380 selectively couples signals between first spare local data line 1376 and first master data line MDQ1 when first word line circuit WL1 is inoperable. Fifth switch circuitry 1384 couples signals between second spare local data line 1378 and third master data line MDQ3 when first word line circuit WL1 is inoperable so that signals are coupled between fifth and sixth bit lines, BL5 and BL6, and first and third master data lines, MDQ1 and MDQ3, respectively, when first word line WL1 is inoperable. Fourth switch circuitry 1382 selectively couples signals between first spare local data line 1376 and second master data line MDQ2 when second word line circuit WL2 is inoperable. Sixth switch circuitry 1386 couples signals between second spare local data line 1378 and fourth master data line MDQ4 when second word line circuit WL2 is inoperable so that signals are coupled between fifth and sixth bit lines, BL5 and BL6, and second and fourth master data lines, MDQ2 and MDQ4, respectively, when second word line circuit WL2 is inoperable.

FIG. 14 shows a blocked diagram of segment slice of unit circuity with a redundancy cell array block and exchangeable hierarchical data line structure according to the present invention. In FIG. 14, the plurality of cell array circuits described with respect to FIG. 3 are generally referred to in FIG. 14 as a cell array except that in FIG. 14 the cell array does not include the local data bus and related sense amplifiers (which are depicted as part of the plurality of cell array circuits in FIG. 3). In FIG. 14, the segment slice includes cell array <0> through cell array <15> corresponding to block <0> through block <15> of FIG. 1.

In FIG. 14, LDQ0 through LDQ 16 denote seventeen local data lines associated with a corresponding seventeen sense amplifiers rows.

The sense amplifier rows corresponding to LDQ1 through LDQ15 are shared sense amplifier rows. For example, the sense amplifier row corresponding to LDQ15 is shared between cell array <14> and cell array <15>.

Similarly, the cell arrays have a two sided sense amplifier structure. For example, cell array <15> corresponds to a double sided sense amplifier row associate with LDQ <15> and LDQ <16>. In FIG. 14, each sense amplifier row contains a single local data line which may be a single wire, a complimentary pair of wires, or two complimentary pairs of wires if it is desired to separate read and write functions in the local data line.

As discussed with respect to FIG. 3, there are four master data lines per segment. The master data lines form a master data bus extending through each block of the unit (e.g., see FIG. 1). FIG. 14 assumes a double segment slice where each of the data lines (i.e., LDQ, MDQ and RWD) may be interpreted as data lines for one or more bits. The bit size is 2 in the case depicted in FIG. 3. The four master data lines of FIG. 14 are labeled MDQL1, MDQL2, MDQU1 and MDQU2.

In FIG. 14, LDQ8, LDQ10, LDQ12, LDQ14 and LDQ16 are selectively couplable to MDQU1. In FIG. 14, LDQ9, LDQ11, LDQ13 and LDQ15 are selectively couplable to MDQU2. When it is desired to sense cell array <8>, LDQ8 is coupled to MDQU1 and LDQ9 is coupled to MDQU2. When it is desired to sense cell array <9>, LDQ10 is coupled to MDQU1 and LDQ9 remains coupled to MDQU2. Similar selected couplings are made in order to sense signals in cell arrays <10> through <15> so that, for the upper half 1420 of the segment slice, signals are transferred over MDQU1 and MDQU2 to and from master sense amplifiers MDQSA U1 and U2. For lower half 1422 of the segment slice, signals are transferred over MDQL1 and MDQL2 between MDQSA L1 and L2 and selected ones of cell arrays <0> through <7>.

Note that LDQ8, associated with common sense amplifier row 1424, is selectively connectable to either of MDQL1 or MDQU1 (e.g., in the same way that common sense amplifier row 1224 of FIG. 12 is selectively couplable to either MDQ1 or MDQ2, but not both). This feature is a part of the exchangeable hierarchical data line structure of this invention.

This feature enables access of two cell arrays at one time to meet certain refresh cycle requirements. For example, cell array <i> and cell array <i +8> may be simultaneously accessed, where i may take on any number from 0 to 7. Signals will be transferred between MDQSA L1 and L2 and the selected cell array <i> at the same time that signals are transferred between MDQSA U1 and U2 and the selected cell array <i+8>.

This improves efficiency of data compression test and refresh operations due to parallel operation between the first and second (i.e., upper and lower) halves. However, under control of MDQSA CTRL control circuitry, only L1 and L2 or U1 and U2 are transferred to or from the read/write data bus RWD (i.e., two data lines) in normal read/write operations. In the data compression test mode, both L1 and U1 (L2 and U2) may be transferred to or from the RWD bus by using a "wired OR" function.

It sometimes happens that a memory is manufactured with a defective word line circuit. When this happens, factory test operations identifies the defective word line circuit. Redundancy cell array <R> in FIG. 14 is provided so that the memory will have spare word line circuits. When the defective word line circuit is identified, a spare word line circuit is assigned to replace the defective word line circuit. To affect the replacement operation, replacement circuitry in the DRAM stores the defective word line circuit address and the address of its replacement. When signals (i.e., provided externally from the DRAM) are applied to the memory to seek access to a defective word line circuit, the replacement circuitry accesses the spare word line circuit instead. This feature of replacing defective word lines circuit with spare word line circuits greatly improves the yield of memory circuit manufacturing.

When the memory is designed without the exchangeable hierarchical data line structure, the spare cell array must include two spare cell arrays (i.e., one associated with MDQU1 and MDQU2, and the other associated with MDQL1 and MDQL2) just as the main cell arrays are portioned into first and second halves as discussed with respect to FIG. 11. In FIG. 11, an extra sense amplifier row is required between cell array <7> and cell array <8>. In FIG. 11, two separate spare cell arrays are required, one for providing spare word line circuits associated with first half 1120 and the other for providing spare word line circuits associated with second half 1122. Since it is unlikely that the same word line circuit will be defective in both the first and second halves, it is usually unnecessary to provide two spare cell arrays when the exchangeable hierarchical data line structure of the present invention is used.

In FIG. 14, only one spare cell array is provided, designated cell array <R>. The exchangeable hierarchical data line structure is provided on local data lines LDQR0 and LDQR1, both associated with the two sided sense amplifier disposed about cell array <R>.

When a defective word line circuit in first half 1420 is replaced with a spare word line circuit from cell array <R>, the exchangeable hierarchical data line structure permits transfer of signals between cell array <R> and MDQSA U1 and U2.

When a defective word line circuit in second half 1422 is replaced with a spare word line circuit from cell array <R>, the exchangeable hierarchical data line structure permits transfer of signals between cell array <R> and MDQSA L1 and L2.

The exchangeable hierarchical data line structure of the present invention saves circuitry by eliminating a need for one of the sense amplifier rows between cell arrays <7> and <8> in FIG. 11 and by eliminating a need for one of the two spare cell arrays (i.e., <R-U>, <R-L>) in FIG>11. This saves circuit area and improves yield in memory manufacturing.

Figure 15:
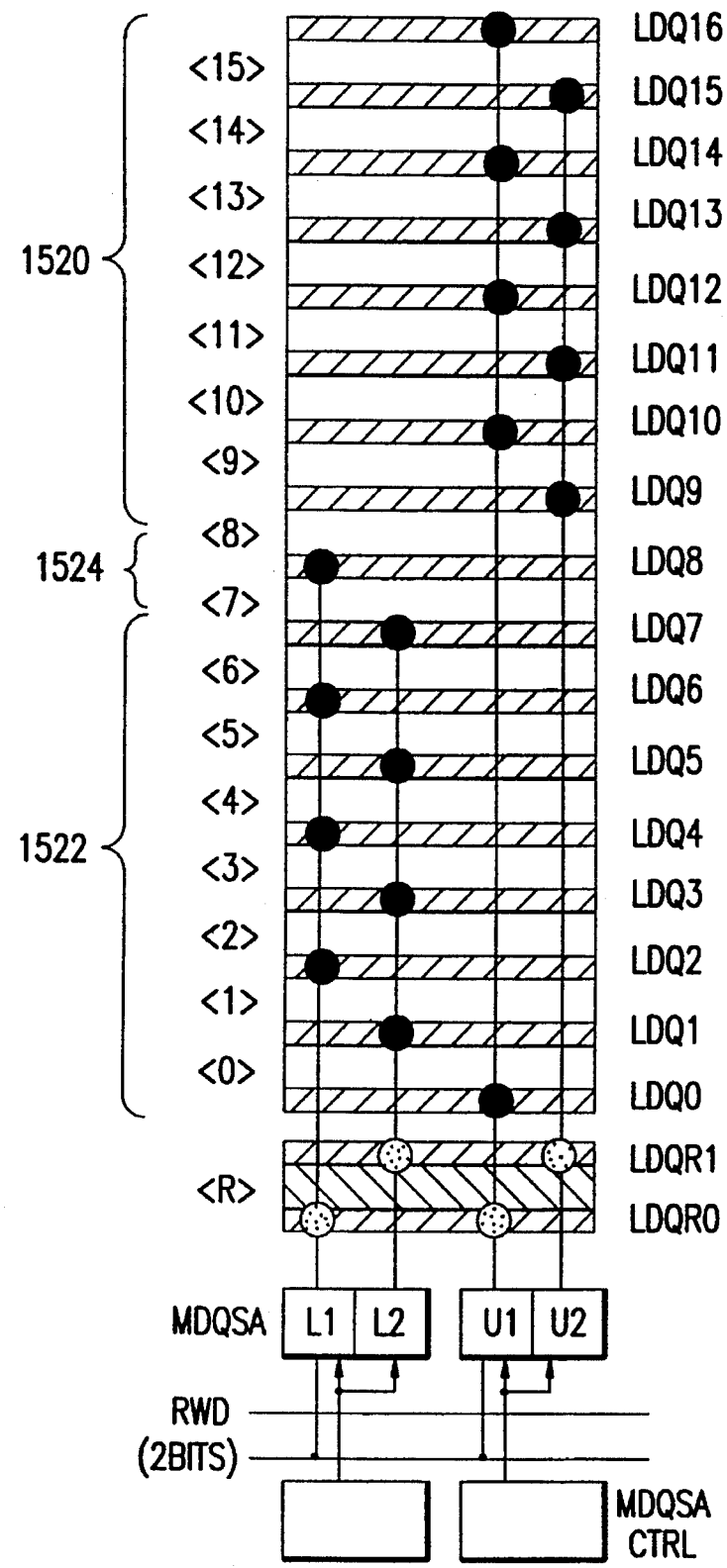
FIG. 15 is a block diagram of a segment slice with redundancy cell array block of unit circuitry with an alternative exchangeable hierarchical data line structure.

FIG. 15 shows a block diagram of a segment slice of unit circuitry with an alternative exchangeable hierarchical data line structure. The embodiment shown in FIG. 15 is similar to the embodiment shown in FIGS. 12 and 14 (i.e., 1520 and 1522 correspond to 1420 and 1422 which correspond to 1220 and 1222). However, the means for connecting the local data lines LDQ0 and LDQ8 with the master data bus are modified, and control means MDQSA CTRL for controlling transfer of signals between master sense amplifiers MDQSA and the read/write data bus RWD is modified.

To modify FIG. 12 to depict a circuit suitable for use in the embodiment shown in FIG. 15, two changes are required. Firstly, switch circuitry 1232 is removed so that common local data line 1228 has no means for connecting with second master data line MDQ2. This change modifies the circuit of FIG. 12 to depict the means for connecting local data line LDQ8 with the master data bus as shown in FIG. 15. Secondly, the switch circuitry selectively coupling third local data line 1250 with first master data line MDQ1 is removed and replaced with switch circuitry selectively coupling third local data line 1250 with second master data line MDQ2. This change modifies the circuit of FIG. 12 to depict the means for connecting local data line LDQ0 with the master data bus as shown in FIG. 15. In FIG. 15, local data line LDQ0 is selectively couplable to master data line MDQU1 (i.e., corresponding to MDQ2 of FIG. 12) instead of master data line MDQL1 as shown in FIG. 14 (i.e., corresponding to MDQ1 of FIG. 12).

The segment slice of the modified FIG. 12 contains first, second, third and fourth cell arrays 1234, 1240, 1246 and 1252, respectively. The segment slice further contains common sense amplifier 1226 shared between the first and second cell arrays, first sense amplifier 1236 shared between the first and third cell arrays, second sense amplifier 1242 shared between the second and fourth cell arrays, third sense amplifier 1248 coupled to the third cell array, and fourth sense amplifier 1254 coupled to the fourth cell array. The common sense amplifier contains common local data line 1228. The first sense amplifier contains first local data line 1238. The second sense amplifier contains second local data line 1244. The third sense amplifier contains third local data line 1250. The fourth sense amplifier contains fourth local data line 1256. The segment slice further contains first, second, third and fourth master data lines MDQ1, MDQ2, MDQ3 and MDQ4, respectively, disposed in a direction to transverse the common, first, second, third and fourth local data lines.

The exchangeable hierarchical data line structure includes selectively operable switches for coupling the common local data line to the first master data line, the first local data line to the third master data line, the second local data line to the fourth master data line, and the fourth local data line to the second master data line when the first and fourth cell arrays are to be accessed. The structure includes selectively operable switches for coupling the common local data line to the first master data line, the first local data line to the third master data line, the second local data line to the fourth master data line, and the third local data line to the second master data line when the second and third cell arrays are to be accessed.

With this arrangement of switch circuits, and suitable modification of control circuit, MDQSA CTRL, it is possible to eliminate a need for one of switch circuit 1230 and switch circuit 1232 to improve the integration density of the DRAM.

Even with the improvements in integration density achievable with the embodiment shown in FIG. 14, it will appreciated that further improvement can be achieved if it were possible to eliminate one of first switch circuit 1230 and second switch circuit 1232 (e.g., see FIG. 12) coupling local data bus LDQ8 to the master data bus of FIG. 14. Generally, achieving high speed requires switching transistors in first switch circuit 1230 and second switch circuit 1232 to subtend an area larger than the area of individual memory cells by a sufficient amount to require that the matrix of memory cells be expanded if the switch is to be included within the same pitch as the memory cells. U.S. patent application of Kato and Watanabe entitled "An Irregular Pitch Layout For a Semiconductor Memory Device" (attorney docket number 629.48641, sequence number T94-0100, filed concurrently with the present application) is incorporated herein by reference and describes methods of adjusting the pitch of the layout of memory circuits. This would have an undesirable effect on the overall integration density of the DRAM. The embodiment shown in FIG. 15 describes how one of the switching circuits may be eliminated while maintaining the advantages of a wide I/0 organization and efficient data compression testing.

In FIG. 15, access to cell array <1> through cell array <7> and cell array <9> through cell array <15> is the same as access according to the embodiment shown in FIG. 14. However, in the embodiment shown in FIG. 15, access to cell array <0> and cell array <8> is different than access in the embodiment of FIG. 14.

In the embodiment shown in FIG. 15, signals are transferred between two bit lines in cell array <0> and master sense amplifiers MDQSA L2 and U1. In contrast, in the embodiment shown in FIG. 14, signals are transferred between two bit lines in cell array <0> and MDQSA L1 and L2. Similarly, in the embodiment shown in FIG. 15, signals are transferred between two bit lines in cell array <8> and master sense amplifier MDQSA L1 and U2.

Thus, a wide I/O organization is achieved while maintaining efficient data compression testing with the embodiment of FIG. 15. However, when accessing two cell arrays, it will be necessary for control circuit MDQSA CTRL to cause signal transfer between master sense amplifiers MDQSA and data bus RWD differently than with the embodiment shown in FIG. 14.

It will be appreciated by persons skilled in the art that master sense amplifiers MDQSA are selectively coupled to data bus RWD through selective switch means, preferably switching transistor controlled by control circuit MDQSA CTRL. Data bus RWD includes first and second read/write data lines. Exchangeable hierarchical data line structure in the embodiment shown in FIG. 15 includes means to transfer signals between the first read/write data line and the first master data line and also between the second read/write data line and the third master data line when the first cell array is to be accessed; means to transfer signals between the first read/write data line and the first master data line and also between the second read/write data line and the fourth master data line when the second cell array is to be accessed; and means to transfer signals between the first read/write data line and the second master data line and also between the second read/write data line and the third master data line when the third cell array is to be accessed; and means to transfer signals between the first read/write data line and the second master data line and also between the second read/write data line and the fourth master data line when the fourth cell array is to be accessed.

By proper selective coupling between master sense amplifiers MDQSA and data bus RWD, it is possible to achieve a wide I/O organization without a need for both first and second switch circuits 1230 and 1232 depicted in FIG. 12, while permitting parallel operation into and out of two cell arrays at the same time to meet certain refresh cycle requirements. In the embodiment shown in FIG. 15, control circuit MDQSA CTRL merely recognizes when cell array <0> is accessed and selectively transfer signals between data bus RWD and MDQSA L2 and U1, or control circuit MDQSA CTRL recognizes when cell array <8> is accessed and selectively transfer signals between data bus RWD and master sense amplifiers MDQSA L1 and U2. Control circuit MDQSA CTRL controls access to other cell arrays in the same way as it controls access to cell arrays in the embodiment shown in FIG. 14.

FIG. 16 is a circuit schematic showing connecting means with an exchangeable hierarchical data line structure. Such circuit schematic may be used to implement common plurality of sense amplifiers 1226 and first and second switch circuits 1230 and 1232 depicted in FIG. 12. Such circuit schematic may be used to implement the master data bus switches MDQSW coupled to local data bus LDQ8 and coupled to redundant local data buses LDQR0 and LDQR1 as depicted in FIG. 14. In FIG. 16, sense amplifier SA includes both the N type sense amplifier portion and the P type sense amplifier portion depicted in FIG. 8. In FIG. 16, bit line equalizer circuit BL EQ typically includes a shunting transistor switch as discussed with reference to FIG. 8. In FIG. 16, MOS transistors controlled by signals MUXil and MUXir form the multiplexer that enables the sense amplifier to be shared between two cell arrays as described with reference to FIG. 8. In FIG. 16, prior to the transfer of signals, the two complimentary wires comprising the local data line are equalized with local data line equalizer LDQ EQ which is made substantially like bit line equalizer circuit BL EQ. Of particular interest in FIG. 16 is the two sets of master data line switches MDQSW corresponding to first and second switch circuits 1230 and 1232 depicted in FIG. 12. Other features depicted in FIG. 16 are described with reference to FIG. 8 or are conventional.

FIG. 17 differs from FIG. 16 in that the two sets of master data line switches MDQSW depicted in FIG. 16 are replaced with a single set of master data line switches MDQSW. All other features of FIG. 17 are the same as corresponding features in FIG. 16. The circuit schematic details of FIG. 16 show an implementation of the local data line LDQ8 and associated sense amplifier depicted in FIG. 15.

Having described preferred embodiments of a novel exchangeable hierarchical data line structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as delined by the appended claims.

Having thus described the invention with the details and particularity required by the patent laws, what is claimed and desired protected by Letters Patent is set forth in the appended claims.

What is claimed is:

1. In a memory having a master data bus, a first half memory unit, a second half memory unit and a common plurality of sense amplifiers disposed therebetween, the common plurality of sense amplifiers including a common local data bus extending therethrough, the master data bus including first and second master data lines, the common local data bus including a common local data line, a circuit comprising:

first switch circuitry to selectively couple data signals between the common local data line and the first master data line; and second switch circuitry to selectively couple data signals between the common local data line and the second master data line, a signal on the common local data line being coupleable to the first master data line when the signal on the common local data line is not coupled to the second master data line, the signal on the common local data line being coupleable to the second master data line when the signal on the common local data line is not coupled to the first master data line.

2. In a memory having a master data bus, a first half memory unit, a second half memory unit and a common plurality of sense amplifiers disposed therebetween, the common plurality of sense amplifiers including a common local data bus extending therethrough, the master data bus including first and second master data lines, the common local data bus including a common local data line, the master data bus further including third and fourth master data lines, the first half memory unit including a first cell array and a first plurality of sense amplifiers, the first cell array including a first bit line, the first plurality of sense amplifiers including a first local data bus extending therethrough, the first local data bus including a first local data line, the second half memory unit including a second cell array and a second plurality of sense amplifiers, the second cell array including a second bit line, the second plurality of sense amplifiers including a second local data bus extending therethrough, the second local data bus including a second local data line, a circuit comprising:

first switch circuitry to selectively couple signals between the common local data line and the first master data line; and second switch circuitry to selectively couple signals between the common local data line and the second master data line, a signal on the common local data line being coupleable to the first master data line when the signal on the common local data line is not coupled to the second master data line, the signal on the common local data line being coupleable to the second master data line when the signal on the common local data line is not coupled to the first master data line, a signal on the first local data line being selectively coupleable to the third master data line, a signal on the second local data line being selectively coupleable to the fourth master data line, the first cell array being disposed between the common plurality of sense amplifiers and the first plurality of sense amplifiers to form a plurality of double sided sense amplifiers about the first cell array when the signal on the common local data line is coupled to the first master data line, the first cell array further including a third bit line, signals on the first and third bit lines being coupled to the first and third master data lines when the signal on the common local data line is coupled to the first master data line, the second cell array being disposed between the common plurality of sense amplifiers and the second plurality of sense amplifiers to form a plurality of double sided sense amplifiers about the second cell array when the signal on the common local data line is coupled to the second master data line, the second cell array further including a fourth bit line, signals on the second and fourth bit lines being coupled to the second and fourth master data lines when the signal on the common local data line is coupled to the second master data line.

3. The circuit of claim 2, wherein:

the first half memory unit further includes a third cell array and a third plurality of sense amplifiers, the third cell array including a fifth bit line, the third plurality of sense amplifiers including a third local data bus extending therethrough, the third local data bus including a third local data line, a signal on the third local data line being selectively coupleable to the first master data line;

the second half memory unit further includes a fourth cell array and a fourth plurality of sense amplifiers, the fourth cell array including a sixth bit line, the fourth plurality of sense amplifiers including a fourth local data bus extending therethrough, the fourth local data bus including a fourth local data line, a signal on the fourth local data line being selectively coupleable to the second master data line;

the third cell array is disposed between the first plurality of sense amplifiers and the third plurality of sense amplifiers to form a plurality of double sided sense amplifiers about the third cell array when the signal on the common local data line is coupled to the second master data line, the third cell array further including a seventh bit line, signals on the fifth and seventh bit lines being coupled to the first and third master data lines when the signal on the common local data line is coupled to the second master data line; and the fourth cell array is disposed between the second plurality of sense amplifiers and the fourth plurality of sense amplifiers to form a plurality of double sided sense amplifiers about the fourth cell array when the signal on the common local data line is coupled to the first master data line, the fourth cell array further including an eighth bit line, signals on the sixth and eighth bit lines being coupled to the second and fourth master data lines when the signal on the common local data line is coupled to the first master data line.

4. In a memory having a master data bus, a first half memory unit, a second half memory unit and a common plurality of sense amplifier disposed therebetween, the common plurality of sense amplifiers including a common local data bus extending therethrough, the master data bus including first and second master data lines, the common local data bus including a common local data line, the master data bus further including third and fourth master data lines, including a first plurality of spare sense amplifiers, a second plurality of spare sense amplifiers and a spare cell array disposed therebetween to form a plurality of double sided spare sense amplifiers about the spare cell array, the first plurality of spare sense amplifiers including a first spare local data bus extending therethrough, the first spare local data bus including a first spare local data line, the second plurality of spare sense amplifiers including a second spare local data bus extending therethrough, the second spare local data bus including a second spare local data line, a circuit comprising:

first switch circuitry to selectively couple signals between the common local data line and the first master data line;

second switch circuitry to selectively couple signals between the common local data line and the second master data line, a signal on the common local data line being coupleable to the first master data line when the signal on the common local data line is not coupled to the second master data line, the signal on the common local data line being coupleable to the second master data line when the signal on the common local data line is not coupled to the first master data line;

third switch circuitry to selectively couple signals between the first spare local data line and the first master data line;

fourth switch circuitry to selectively couple signals between the first spare local data line and the second master data line, a signal on the first spare local data line being coupleable to the first master data line when the signal on the first spare local data line is not coupled to the second master data line, the signal on the first spare local data line being coupleable to the second master data line when the signal on the first spare local data line is not coupled to the first master data line;

fifth switch circuitry to selectively couple signals between the second spare local data line and the third master data line; and sixth switch circuitry to selectively couple signals between the second spare local data line and the fourth master data line, a signal on the second spare local data line being coupleable to the third master data line when the signal on the second spare local data line is not coupled to the fourth master data line, the signal on the second spare local data line being coupleable to the fourth master data line when the signal on the second spare local data line is not coupled to the third master data line.

5. The circuit of claim 4, wherein:

the first half memory unit includes a first cell array and a first plurality of sense amplifiers, the first cell array including a first bit line, the first plurality of sense amplifiers including a first local data bus extending therethrough, the first local data bus including a first local data line, a signal on the first local data line being selectively coupleable to the third master data line, the first cell array having a first word line circuit characterized as being one of operable and inoperable;

the second half memory unit includes a second cell array and a second plurality of sense amplifiers, the second cell array including a second bit line, the second plurality of sense amplifiers including a second local data bus extending therethrough, the second local data bus including a second local data line, a signal on the second local data line being selectively coupleable to the fourth master data line, the second cell array having a second word line circuit characterized as being one of operable and inoperable;

the first cell array is disposed between the common plurality of sense amplifiers and the first plurality of sense amplifiers to form a plurality of double sided sense amplifiers about the first cell array when the signal on the common local data line is coupled to the first master data line and the first word line circuit is operable, the first cell array further including a third bit line, signals on the first and third bit lines being coupled to the first and third master data lines when the signal on the common local data line is coupled to the first master data line and the first word line circuit is operable;

the second cell array is disposed between the common plurality of sense amplifiers and the second plurality of sense amplifiers to form a plurality of double sided sense amplifiers about the second cell array when the signal on the common local data line is coupled to the second master data line and the second word line circuit is operable, the second cell array further including a fourth bit line, signals on the second and fourth bit lines being coupled to the second and fourth master data lines when the signal on the common local data line is coupled to the second master data line and the second word line circuit is operable;

the spare cell array includes fifth and sixth bit lines coupled to the first spare local data line and the second spare local data line, respectively;

the third switch circuitry couples signals between the first spare local data line and the first master data line when the first word line circuit is inoperable;

the fifth switch circuitry couples signals between the second spare local data line and the third master data line when the first word line circuit is inoperable so that signals are coupled between the fifth and sixth bit lines and the first and third master data lines, respectively;

the fourth switch circuitry couples signals between the first spare local data line and the second master data line when the second word line circuit is inoperable; and the sixth switch circuitry couples signals between the second spare local data line and the fourth master data line when the second word line circuit is inoperable so that signals are coupled between the fifth and sixth bit lines and the second and fourth master data lines, respectively.

6. In a memory containing first, second, third and fourth cell arrays, the memory further containing a common sense amplifier shared between the first and second cell arrays, the memory further containing a first sense amplifier shared between the first and third cell arrays, the memory further containing a second sense amplifier shared between the second and fourth cell arrays, the memory further containing a third sense amplifier coupled to the third cell array, the memory further containing a fourth sense amplifier coupled to fourth cell array, the common sense amplifier containing a common local data line, the first sense amplifier containing a first local data line, the second sense amplifier containing a second local data line, the third sense amplifier containing a third local data line, the fourth sense amplifier containing a fourth local data line, the memory further containing first, second, third and fourth master data lines disposed in a direction to transverse the common, first, second, third and fourth local data lines, a circuit comprising:

means for coupling (i) the common local data line to the first master data line, (ii) the first local data line to the third master data line, (iii) the second local data line to the fourth master data line, and (iv) the fourth local data line to the second master data line when the first and fourth cell arrays are to be accessed; and means for coupling (i) the common local data line to the first master data line, (ii) the first local data line to the third master data line, (iii) the second local data line to the fourth master data line, and (iv) the third local data line to the second master data line, when the second and third cell arrays are to be accessed.

7. The circuit of claim 6, wherein:

the memory further includes first and second read/write data lines; and the circuit further includes means to transfer signals between the first read/write data line and the first master data line and between the second read/write data line and the third master data line when the first cell array is to be accessed;

the circuit further includes means to transfer signals between the first read/write data line and the first master data line and between the second read/write data line and the fourth master data line when the second cell array is to be accessed;

the circuit further includes means to transfer signals between the first read/write data line and the second master data line and between the second read/write data line and the third master data line when the third cell array is to be accessed; and the circuit further includes means to transfer signals between the first read/write data line and the second master data line and between the second read/write data line and the fourth master data line when the fourth cell array is to be accessed.

* * * * *